United States Patent
Takegami et al.

(10) Patent No.: US 9,515,213 B2
(45) Date of Patent: Dec. 6, 2016

(54) BACK PROTECTIVE SHEET FOR SOLAR CELL MODULE AND SOLAR CELL MODULE

(71) Applicant: FUJIFILM Corporation, Tokyo (JP)

(72) Inventors: Ryuta Takegami, Shizuoka (JP); Naomi Yasuda, Shizuoka (JP); Makoto Fukuda, Shizuoka (JP)

(73) Assignee: FUJIFILM CORPORATION, Tokyo (JP)

(*) Notice: Subject to any disclaimer, the term of this patent is extended or adjusted under 35 U.S.C. 154(b) by 232 days.

(21) Appl. No.: 14/448,133

(22) Filed: Jul. 31, 2014

(65) Prior Publication Data

US 2014/0338733 A1 Nov. 20, 2014

Related U.S. Application Data

(63) Continuation of application No. PCT/JP2013/051699, filed on Jan. 28, 2013.

(30) Foreign Application Priority Data

Feb. 3, 2012 (JP) ................................ 2012-021864

(51) Int. Cl.
  *C08J 7/04* (2006.01)
  *C09C 1/36* (2006.01)
  *C09C 3/06* (2006.01)
  (Continued)

(52) U.S. Cl.
  CPC ............ *H01L 31/0487* (2013.01); *C08J 7/047* (2013.01); *C08L 67/00* (2013.01); *H01L 31/049* (2014.12); *C08J 2367/02* (2013.01); *C08J 2483/04* (2013.01); *C09C 1/0084* (2013.01); *C09C 1/3661* (2013.01); *Y02E 10/50* (2013.01)

(58) Field of Classification Search
  None
  See application file for complete search history.

(56) References Cited

U.S. PATENT DOCUMENTS 8,518,523 B2   8/2013  Hashimoto et al.
2007/0269650 A1* 11/2007  Leuninger ............. C09D 5/028
                                                   428/327

(Continued)

FOREIGN PATENT DOCUMENTS

CN    101056951 A    10/2007
EP    2 262 000 A1   12/2010

(Continued)

OTHER PUBLICATIONS

International Preliminary Report on Patentability issued by WIPO on Aug. 14, 2014 in connection with related Intl. Patent Appln. No. PCT/JP2013/051699.

(Continued)

*Primary Examiner* — Ramsey Zacharia
(74) *Attorney, Agent, or Firm* — Jean C. Edwards, Esq.; Edwards Neils LLC

(57) ABSTRACT

A back protective sheet for a solar cell module containing a polyester support that is biaxially stretched and then subjected to a thermal fixation treatment; and a polymer layer arranged to be in contact with at least one surface of the polyester support, wherein the polymer layer contains a binder having at least one functional group selected from a carboxyl group, a hydroxyl group, an amino group, a sulfonic acid group, and a carbonyl group; a pigment; and a crosslinking agent-derived structure, and the polyester support contains a polyester, a pigment, and an terminal blocking agent, has excellent adhesion between the support and the functional layer after wet heat aging.

11 Claims, 2 Drawing Sheets

(51) Int. Cl.
   *H01L 31/049*   (2014.01)
   *H01L 31/048*   (2014.01)
   *C08L 67/00*   (2006.01)
   *C09C 1/00*   (2006.01)

(56) References Cited

U.S. PATENT DOCUMENTS

| | | |
|---|---|---|
| 2010/0000603 A1 | 1/2010 | Tsuzuki et al. |
| 2011/0214720 A1 | 9/2011 | Hashimoto et al. |
| 2011/0284075 A1 | 11/2011 | Hatakeyama et al. |
| 2012/0021197 A1 | 1/2012 | Matsumura et al. |

FOREIGN PATENT DOCUMENTS

| | | |
|---|---|---|
| JP | 2006-270025 A | 10/2006 |
| JP | 2007-150084 A | 6/2007 |
| JP | 2010-519742 A | 6/2010 |
| JP | 2011-29397 A | 2/2011 |
| JP | 2011-165967 A | 8/2011 |
| JP | 2011-184488 A | 9/2011 |
| WO | 2008/143719 A2 | 11/2008 |
| WO | 2008/143719 A3 | 11/2008 |
| WO | 2009/123357 A1 | 10/2009 |
| WO | 2011/099390 A1 | 8/2011 |

OTHER PUBLICATIONS

International Search Report issued in PCT/JP2013/051699 on Apr. 23, 2013.
Written Opinion issued in PCT/JP2013/051699 on Apr. 23, 2013.
First Office Action issued by the State Intellectual Property Office of China on Nov. 3, 2015 in connection with Chinese Patent Application No. 201380007798.6.
Extended European Search Report issued by the European Patent Office on Aug. 4, 2015 in connection with European Patent Application No. 13743205.0.
Second Office Action issued by the State Intellectual Property Office of China on Jun. 29, 2016 in connection with Chinese Patent Application No. 201380007798.6.

\* cited by examiner

BACK PROTECTIVE SHEET FOR SOLAR CELL MODULE AND SOLAR CELL MODULE

CROSS-REFERENCE TO RELATED APPLICATIONS

This application is a Continuation of PCT International Application No. PCT/JP2013/051699 filed on Jan. 28, 2013, which was published under PCT article 21(2) in Japanese, and which claims priority under 35 U.S.C. Section 119(a) to Japanese Patent Application No. 2012-021864 filed on Feb. 3, 2012. Each of the above applications is hereby expressly incorporated by reference, in its entirety, into the present application.

BACKGROUND OF THE INVENTION

Field of the Invention

The present invention relates to a back protective sheet for a solar cell module and a solar cell module.

Background Art

A solar cell is an environmental load-reducing power generation system that releases no carbon dioxide in power generation, and has become greatly popularized recently.

A solar cell module generally has a structure in which a photovoltaic cell is sandwiched between a front glass on the side on which sunlight is incident, and a back protective sheet for a solar cell module (a so-called back sheet) arranged on the side opposite (back side) to the side on which sunlight is incident, and the space between the front glass and the photovoltaic cell and the space between the photovoltaic cell and the back sheet each are sealed up, respectively, with an EVA (ethylene-vinyl acetate) resin or the like.

The back sheet has a function to prevent from penetration of moisture from the back surface of the solar cell module, for which glass, fluororesin, or the like has been heretofore used. Recently, however, a polyester has become used from the viewpoint of the cost. Further, as the front substrate, a glass substrate is generally used from the viewpoint that its light transmittance is high and a relatively high strength can be maintained. However, there is also a recent approach to use a back protective sheet in place of the glass substrate or the like.

A back protective sheet for a solar cell module as such a protective sheet for a solar cell may be provided with a functional layer on a polymer support in accordance with the desired characteristics in some cases. For example, a back sheet is used on the back side of a solar cell and is desired to have durability (hydrolysis resistance and electric insulation), adhesiveness of an Si cell to a sealing material, reflectance, and the like. As a back sheet provided with such a functional layer, Patent References 1 to 4 propose a coating type back sheet, and Patent References 5 to 7 propose a laminate type back sheet.

The coating type back sheet is prepared by applying a solution prepared by dissolving functional materials in an organic solvent or water, onto a support sheet of a polyester or the like at room temperature or at a suitable high temperature, thereby affording a structure in which the support and the functional layer are arranged to be in contact with each other and an adhesive or the like is not interposed therebetween. An advantage of the coating type back sheet is that the production cost can be reduced, as compared with the laminate type back sheet as described in Patent References 5 to 7.

On the other hand, there is the case where since an adhesive is not used and a functional layer is provided by coating, the adhesion between the support sheet and the functional layer is deteriorated. In particular, it has now become investigated to install a solar cell module in a high-temperature high-humidity environment in which the back protective sheet for a solar cell module itself is easily deformed, and operate solar cell module for a long time from the viewpoints of improvement in power generation efficiency and size in recent years, and particularly, it is desired to maintain the adhesion between the layers of the back sheets over time in a high-temperature high-humidity environment.

CITATION LIST

Patent References

Patent Reference 1: JP-T-2010-519742
Patent Reference 2: JP-A-2011-29397
Patent Reference 3: JP-A-2011-165967
Patent Reference 4: JP-A-2011-184488
Patent Reference 5: WO2009/123357
Patent Reference 6: JP-A-2007-150084
Patent Reference 7: JP-A-2006-270025

SUMMARY OF INVENTION

The present inventors have investigated the back protective sheet for a solar cell module as described in Patent References 1 to 4, and as a result, they have found that there is a problem in the adhesiveness between the polymer support and the functional layer.

An object of the present invention to be accomplished by the present invention is to provide a back protective sheet for a solar cell module, which has excellent adhesion between the support and the functional layer after wet heat aging.

The present inventors have made extensive studies in order to solve the above-described problems, and particularly, they have also investigated the improvement of the characteristics of the polyester support and the functional layer. In Patent References 1 to 4, the adhesion between the support and the functional layer after the wet heat aging is not noted, and for the back protective sheet for a solar cell module described in these documents, there is no description on the addition of an terminal blocking agent to a polyester support. Further, in Patent Reference 5, an terminal blocking agent is added to a polyester support, but in the same manner as in Patent References 1 to 4, the adhesion between the support and the functional layer after the wet heat aging is not noted, and for the back protective sheet for a solar cell module described in these document, there is no description on the addition of a pigment to a functional layer or a polyester support.

Under these circumstances, the present inventors have finally found that a polyester support to which a pigment and an terminal blocking agent have been added is biaxially stretched and then subjected to a thermal fixation treatment, a coating liquid including a binder having a specific functional group, a pigment, and a crosslinking agent is then coated thereon to form a functional polymer layer, whereby the adhesion between the support and the functional layer after wet heat aging can be improved.

The present invention that is a specific means for solving the above-described problems is as follows.

[1] A back protective sheet for a solar cell module having a polyester support that is biaxially stretched and then subjected to a thermal fixation treatment, and a polymer layer arranged to be in contact with at least one surface of the polyester support, in which the polymer layer contains a binder having at least one functional group selected from a carboxyl group, a hydroxyl group, an amino group, a sulfonic acid group, and a carbonyl group, a pigment, and a crosslinking agent-derived structure, and the polyester support contains a polyester, a pigment, and an terminal blocking agent.

[2] In the back protective sheet for a solar cell module as described in [1], the polyester support preferably contains the terminal blocking agent in an amount of 0.1% by mass to 2.0% by mass with respect to the polyester support.

[3] In the back protective sheet for a solar cell module as described in [1] or [2], the pigment in the polyester support is preferably titanium oxide having an Al-treated outermost surface.

[4] In the back protective sheet for a solar cell module as described in any one of [1] to [3], the polyester support preferably contains the pigment in an amount of 3% by mass to 20% by mass with respect to the polyester support.

[5] In the back protective sheet for a solar cell module as described in any one of [1] to [4], the terminal blocking agent is preferably a polycarbodiimide.

[6] In the back protective sheet for a solar cell module as described in [5], the polycarbodiimide is preferably a polycarbodiimide having a molecular weight of 3000 to 50000.

[7] In the back protective sheet for a solar cell module as described in [5] or [6], the polycarbodiimide is preferably a polycarbodiimide having a melting point of 80° C. to 170° C.

[8] In the back protective sheet for a solar cell module as described in any one of [1] to [7], the binder contained in the polymer layer is preferably a water-based latex.

[9] In the back protective sheet for a solar cell module as described in any one of [1] to [8], the binder contained in the polymer layer preferably contains a composite polymer including a recurring portion of a siloxane structural unit represented by the below-identified formula (1) in an amount of 15% by mass to 99% by mass, and a recurring portion of a non-siloxane structural unit copolymerizable with the recurring portion in an amount of 85% by mass to 1% by mass in the molecule. Formula (1)

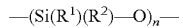

In the formula (1), $R^1$ and $R^2$ each independently represent a hydrogen atom, a halogen atom, or a monovalent organic group capable of covalent-bonding to the Si atom, and n represents a natural number. In the case where n is 2 or more, a plurality of $R^1$ and $R^2$ may be the same as or different from each other.

[10] In the back protective sheet for a solar cell module as described in any one of [1] to [9], the binder contained in the polymer layer is preferably a binder having a carboxyl group.

[11] In the back protective sheet for a solar cell module as described in any one of [1] to [10], the polymer layer preferably contains a black pigment.

[12] In the back protective sheet for a solar cell module as described in any one of [1] to [11], the thickness of the polymer layer is preferably from 1 μm to 20 μm.

[13] In the back protective sheet for a solar cell module as described in any one of [1] to [12], the polymer layer is preferably formed by coating onto a polyester support that is biaxially stretched and then subjected to a thermal fixation treatment.

[14] A solar cell module including the back protective sheet for a solar cell module as described in any one of [1] to [13].

According to the present invention, a back protective sheet for a solar cell module, having excellent adhesion between a support and a functional layer after wet heat aging, can be provided.

DESCRIPTION OF EMBODIMENTS

Hereinafter, the back protective sheet for a solar cell module and the solar cell module of the present invention will be described in detail.

[Back Protective Sheet for Solar Cell Module]

The back protective sheet for a solar cell module of the present invention (which is hereinafter also referred to as the back sheet of the present invention) has a polyester support that is biaxially stretched and then subjected to a thermal fixation treatment, and a polymer layer arranged to be in contact with at least one surface of the polyester support, in which the polymer layer contains a binder having at least one functional group selected from a carboxyl group, a hydroxyl group, an amino group, a sulfonic acid group, and a carbonyl group, a pigment, and a crosslinking agent-derived structure, and the polyester support contains a polyester, a pigment, and an terminal blocking agent.

The back protective sheet for a solar cell module of the present invention has improved adhesion between a support and a functional layer after wet heat aging, by employing such a configuration. Not wishing to be bound to any theory, it may be mentioned that the surface energy of the both is close to each other by putting a pigment to the polyester support and the polymer layer, and as a result, the adhesion force is improved. Further, by adding a binder having a specific functional group to the polymer layer to perform a certain reaction in the interface with an terminal blocking agent contained in the polyester support, the adhesion force is improved. In addition, since the pigment contained in the polyester support forms a small unevenness on the surface of the polyester support, the adhesion force is improved by an anchoring effect. In particular, if the polyester support contains both of the pigment and the terminal blocking agent, the adhesion force is extremely improved, but a combined use of the pigment and the terminal blocking agent for an effect of remarkable improvement of the adhesion has not been known in the related art.

Hereinafter, a preferred configuration of the back protective sheet for a solar cell module of the present invention will be described.

Further, the back protective sheet for a solar cell module of the present invention is more preferably configured to increase the hydrolysis resistance after wet heat aging.

<Configurations>

Figure 1:
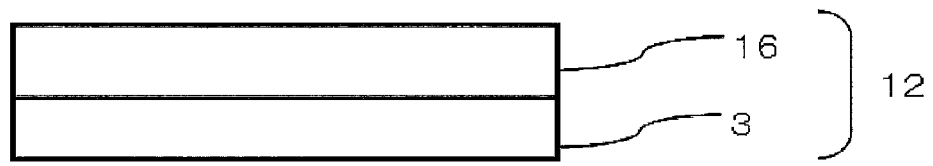
FIG. 1 is a schematic view showing one example of the cross-section of the back protective sheet for a solar cell module of the present invention.
Figure 2:
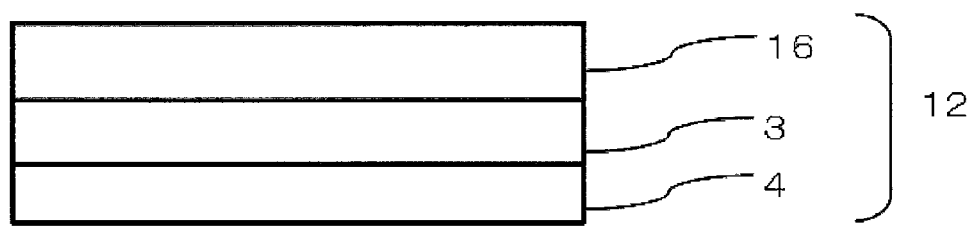
FIG. 2 is a schematic view showing another example of the cross-section of the back protective sheet for a solar cell module of the present invention.
Figure 3:
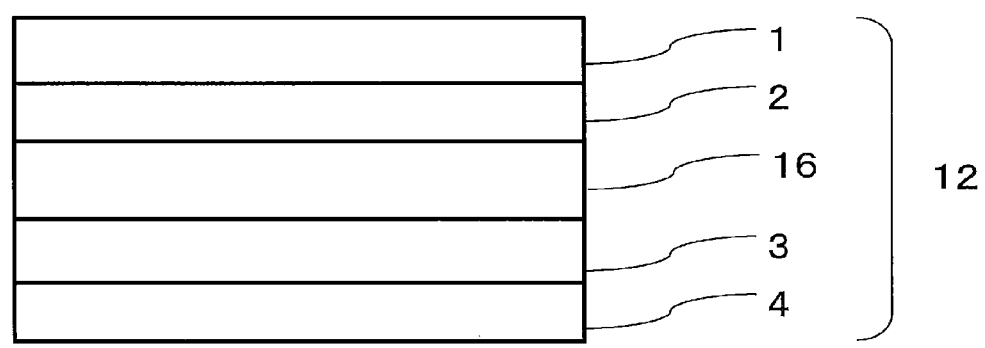
FIG. 3 is a schematic view showing still another example of the cross-section of the back protective sheet for a solar cell module of the present invention.

First, preferred configurations of the back protective sheet for a solar cell module of the present invention are described in FIGS. 1 to 3.

In the back protective sheet for a solar cell module described in FIG. 1, a polymer layer 3 is arranged to be in contact with one surface side of a polyester support 16 that is biaxially stretched and then subjected to a thermal fixation treatment, and the polymer layer 3 forms an outermost layer.

In the back protective sheet for a solar cell module described in FIG. 2, the polymer layer 3 is arranged to be in contact with one surface side of the polyester support 16, and further, a weather-resistant layer 4 is arranged thereon, thereby forming an outermost layer.

In the back protective sheet described in FIG. 3, an undercoat layer 2 and a readily adhesive layer 1 are provided on the surface side opposite to the surface on which the polymer layer 3 of the polyester support 16 is provided.

In addition, in the back protective sheet for a solar cell module of the present invention, although not being shown in FIGS. 1 to 3, any polymer layer may be provided between the polyester support 16 and the polymer layer 3.

Next, for the back protective sheet for a solar cell module of the present invention, the details of the preferred embodiments of the respective layers will be described.

<Polyester Support>

For the back protective sheet for a solar cell module of the present invention, the polyester support that is biaxially stretched and then subjected to a thermal fixation treatment is used. Preferably, the thermal shrinkage in an in-plane first direction after being aged at 150° C. for 30 minutes is from 0.2% to 1.0% and the thermal shrinkage thereof in a second direction perpendicular to the first direction is from −0.3% to 0.5%. In particular, it is preferable that the thermal shrinkage of the polymer support before laminating the polymer layer as described later fall within the range from the viewpoint of improving the adhesiveness thereof after wet heat aging.

The first direction is preferably the film longitudinal direction, and for example, the first direction is preferably the film conveying direction in forming the polyester support (which is hereinafter also referred to as a machine direction, MD). On the other hand, the second direction is preferably the film widthwise direction, and for example, the second direction is preferably the direction perpendicular to the film conveying direction in producing the polyester support (which is hereinafter also referred to as a transverse direction, TD).

Preferably, the thermal shrinkage in the first direction (preferably the MD direction) is from 0.3% to 0.8%, and more preferably from 0.4% to 0.7%. On the other hand, the thermal shrinkage in the second direction (preferably the TD direction) is more preferably from −0.1% to 0.5%, and particularly preferably from 0.0% to 0.5%.

The in-plane thermal shrinkage of the polyester support after being aged at 150° C. for 30 minutes can be adjusted by a film formation condition (a stretching condition in the film formation, in particular, a thermal relaxation condition after stretching).

Further, in general, in the case where the molecular weight of the polyester support is large, the thermal shrinkage thereof is large, and is, for example, about 2% in some cases. In order to enhance the hydrolysis resistance of the polyester support as described below, solid-phase polymerization is carried out to increase the molecular weight (IV), further, the terminal carboxyl group content AV is reduced to be 20 eq/t or less, and in addition, the polyester support is preferably formed so as to satisfy the thermal shrinkage condition.

For the back protective sheet for a solar cell module of the present invention, the thickness of the polyester support is not particularly limited, but is preferably, for example, 30 μm to 300 μm, more preferably from 60 μm to 300 μm, and particularly preferably 100 μm to 300 μm.

Furthermore, the polyester support preferably has a thickness of 145 μm to 300 μm since the change in mechanical characteristics before and after the moisture resistance testing is small with a small specific range of thickness. In addition, it is preferable that the change in the dielectric breakdown strength before and after the moisture resistance testing is also small. In the present invention, the thickness of the polyester support is more preferably from 180 μm to 270 μm, and even more preferably from 210 μm to 250 μm, from the viewpoint of exhibiting an effect of further improving the wet heat durability of the adhesiveness.

In addition, recently, not only increasing the output power of a solar cell but also improving the electric insulating capability of a back sheet for a solar cell has become desired. In general, the electric insulation is proportional to the thickness of the back sheet, and therefore a thicker back sheet is desired. Regarding this, by allowing the thickness of the polyester support to fall within the preferred range, there can be provided a back protective sheet for a solar cell module additionally having a good electric insulating capability.

Examples of the polyester support include substrates of PET, PEN, PBT, or the like. The substrate may be in a film shape or sheet shape.

(Polyester of Polyester Support)

The polyester for use as the polyester support in the present invention is a linear saturated polyester that is synthesized from an aromatic dibasic acid or an ester-forming derivative thereof and a diol or an ester-forming derivative thereof. Specific examples of the polyester include films or sheets of polyethylene terephthalate, polyethylene isophthalate, polybutylene terephthalate, poly(1,4-cyclohexylenedimethylene terephthalate), polyethylene-2,6-naphthalate, and the like. Among these, polyethylene terephthalate and polyethylene-2,6-naphthalate are particularly preferred from the viewpoint of the balance between the mechanical properties and the cost.

The polyester may be a homopolymer or a copolymer. Further, the substrate may be a blend of a polyester with a small amount of another kind of resin, for example, a polyimide, or the like.

In the polymerization of the polyester in the present invention, it is preferable to use an Sb-based, Ge-based, or Ti-based compound as a catalyst from the viewpoint of controlling the carboxyl group content in the polyester to fall within a predetermined range or less. Among these, a Ti-based compound is particularly preferred. In the case of using the Ti-based compound, it is preferable that the Ti-based compound is used as the catalyst in an amount of 1 ppm to 30 ppm, and more preferably from 3 ppm to 15 ppm as the Ti element-equivalent amount. If the Ti element-equivalent amount of the Ti-based compound to be used falls within the range, it is possible to control the terminal carboxyl group content to fall within the range as described below, and it is also possible to keep the hydrolysis resistance of the polyester support low.

In the synthesis of the polyester using a Ti-based compound, for example, the methods described in JP-B-8-301198, Japanese Patent Nos. 2543624, 3335683, 3717380, 3897756, 3962226, 3979866, 3996871, 4000867, 4053837, 4127119, 4134710, 4159154, 4269704, 4313538, or the like may be applied.

In the back protective sheet for a solar cell module of the present invention, the terminal carboxyl group content AV in the polyester support is preferably 20 eq/t (ton, the same shall apply hereinunder) or less from the viewpoint of increasing the hydrolysis resistance of the support and of preventing the strength of the support from lowering during wet heat aging. The content is more preferably from 5 eq/t to 18 eq/t, and particularly preferably from 9 eq/t to 17 eq/t.

The carboxyl group content in the polyester can be adjusted by the type of the polymerization catalyst before film formation and the solid-phase polymerization condition after ordinary polymerization, and also by the film formation conditions (the film formation temperature and time, the stretching condition, and the heat relaxation condition), or the like. In particular, it is preferable that the content be controlled by the solid-phase polymerization condition before formation of the polyester support in the form of a film. Preferably, the terminal carboxyl group content in the starting polyester after solid-phase polymerization and before formation into a film-shaped polyester support is from 1 eq/t to 20 eq/t, more preferably from 3 eq/t to 18 eq/t, and particularly preferably from 6 eq/t to 14 eq/t.

The carboxyl group content (AV) can be measured according to the method described in H. A. Pohl, Anal. Chem. 26 (1954) 2145. Specifically, an intended polyester is ground into powder and then dried in a vacuum drier at 60° C. for 30 minutes. Next, 0.1000 g of the polyester immediately after the drying is weighed, and 5 ml of benzyl alcohol is added thereto, followed by stirring with heating for dissolution at 205° C. for 2 minutes. The solution is cooled, 15 ml of chloroform is then added thereto, and using phenol red as an indicator, the sample is titered with an alkali standard liquid (0.01 N KOH-benzyl alcohol mixed solution) to the neutralization point (pH=7.30±0.10). From the titered data, the content is calculated.

Moreover, in the back protective sheet for a solar cell module of the present invention, the intrinsic viscosity IV (molecular weight) of the polyester support is preferably 0.65 dl/g or more, more preferably from 0.68 dl/g to 0.85 dl/g, and particularly preferably from 0.70 dl/g to 0.80 dl/g.

The intrinsic viscosity IV of the polyester support can be adjusted by the kind of the polymerization catalyst and the film formation condition (film formation temperature and time). In particular, it is preferable that the intrinsic viscosity be controlled by the solid-phase polymerization condition before formation of a film-shaped polyester support. Particularly preferably, the intrinsic viscosity IV of the starting polyester before formation thereof into a film-shaped polyester support is from 0.68 dl/g to 0.90 dl/g, more preferably from 0.70 to 0.85 dl/g, and particularly preferably from 0.72 dl/g to 0.83 dl/g.

The IV value may be measured as follows: an intended polyester is ground into powder, dried in a vacuum drier at 60° C. for 30 minutes, and dissolved in a mixed solvent of 1,2,2-tetrachloroethane/phenol (=2/3 [ratio by mass]) to be 0.01 g/ml, and using an Ubbelohde viscometer (AVL-6C, by Asahi Kasei Technosystems), the sample is measured at a temperature of 25° C. Further, the sample dissolution is carried out for 15 minutes to 30 minutes at 120° C.

In the back protective sheet for a solar cell module of the present invention, the peak of tan δ of the polyester support, as measured with a dynamic viscoelastometer, is preferably at 123° C. or higher, more preferably at from 123° C. to 130° C., and particularly preferably at from 124° C. to 128° C.

The peak of tan δ of the polyester support can be adjusted by the kind of the polymerization catalyst before film formation and the solid-phase polymerization condition after ordinary polymerization, and also by the film formation condition (film formation temperature and time, stretching condition and heat relaxation condition), or the like. In particular, it is preferable to control the data by the stretching conditions (stretching draw ratio and thermal fixation temperature) that can be adjusted online.

The peak of tan δ is measured as follows: After conditioned at 25° C. and at a relative humidity of 60% for 2 hours or more, the sample is analyzed with a commercially-available dynamic viscoelastometer (Vibron: DVA-225 (manufactured by ITK)) at a heating speed of 2° C./rain within a measurement temperature range of from 30° C. to 200° C. and at a frequency of 1 Hz.

The polyester support is preferably one subjected to solid-phase polymerization after polymerization. This can easily result in the preferred carboxyl group content and the preferred intrinsic viscosity. The solid-phase polymerization may be in a continuous method (where the resin is filled in a tower, gradually circulated therein with heating for a predetermined period of time, and then discharged) or in a batch method (where the resin is put into a container and heated therein for a predetermined period of time). Specifically, the methods described in Japanese Patent Nos. 2621563, 3121876, 3136774, 3603585, 3616522, 3617340, 3680523, 3717392, 4167159, or the like may be applied to the solid-phase polymerization.

The temperature of the solid-phase polymerization is preferably from 170° C. to 240° C., more preferably from 180° C. to 230° C., and even more preferably from 190° C. to 220° C. The time of the solid-phase polymerization is preferably from 5 hours to 100 hours, more preferably from 10 hours to 75 hours, and even more preferably from 15 hours to 50 hours. The solid-phase polymerization is preferably carried out in vacuum or in a nitrogen atmosphere.

(Pigment of Polyester Support)

The back protective sheet for a solar cell of the present invention contains a pigment in the polyester support. The pigment contained in the polyester support is not particularly limited, and examples thereof include inorganic pigments such as titanium oxide, barium sulfate, silicon oxide, aluminum oxide, magnesium oxide, calcium carbonate, kaolin, talc, ultramarine, iron blue, carbon black, and the like; and organic pigments such as phthalocyanine blue, phthalocyanine green, and the like.

The back protective sheet for a solar cell may have a function to reflect the sunlight that is incident on the front surface of a module and passes through the cell to bring it back to the cell in order to increase the power generation efficiency. Here, the sunlight having passed through the cell is usually reflected by a functional layer formed on the polyester support, but in order to reflect the sunlight having passed through the functional layer into the polyester support, a white pigment is preferably contained in the polyester support in the present invention.

The content of the white pigment in the polyester support is preferably from 3% by mass to 20% by mass, and more preferably from 5% by mass to 15% by mass, with respect to the total mass of the polyester support, from the viewpoint of improving the adhesion between the support and the functional layer after wet heat aging.

As the white pigment, an inorganic pigment suitably selected from titanium dioxide, barium sulfate, silicon oxide, aluminum oxide, magnesium oxide, calcium carbonate, kaolin, and talc may be contained. Among these, titanium oxide is preferred. Further, in the case where a polyester support is produced by diluting a master batch (which is also referred to as a master pellet), a pigment master batch including a pigment at a concentration of 40% by mass to 60% by mass may be produced and used.

The average particle diameter of the white pigment is preferably from 0.03 μm to 0.8 μm, and more preferably from about 0.15 μm to 0.5 μm in terms of a volume average particle diameter. When the average particle diameter falls within the range, the light reflection efficiency is high. The average particle diameter is a value measured with a laser analyzing/scattering particle diameter distribution analyzer LA950 (manufactured by Horiba Seisakusho Corp.).

In addition, in the case where the polyester support contains 2 or more kinds of white pigments, the total amount of the content of all the white pigments in the polyester support is preferably in the range.

(Terminal blocking agent of Polyester Support)

The back protective sheet for a solar cell of the present invention contains an terminal blocking agent in the polyester support.

Further, the terminal blocking agent is an additive that reacts with a terminal carboxyl group of a polyester to reduce the amount of the carboxyl terminals of the polyester.

When an terminal blocking agent is present in the polyester support, it reacts with a carboxylic acid at the terminal of a polyester and thus has an effect of easily reducing the amount (AV value) of the terminal carboxylic acids of the polyester (that is, the weather resistance can be maintained high by inhibiting the hydrolysis of the polyester promoted by the terminal carboxylic acid). Further, the terminal blocking agent has a high volume and inhibits the movement of the polyester molecule passing through the free volume. As a result, there is an effect of inhibiting thermal shrinkage causing the movement of molecules.

For the back protective sheet for a solar cell of the present invention, the terminal blocking agent is contained in the polyester support in an amount of preferably 0.1% by mass to 2.0% by mass, more preferably 0.1% by mass to 1.0% by mass, and particularly preferably 0.2% by mass to 0.5% by mass, with respect to the polyester support, from the viewpoint of improving the adhesion between the support and the functional layer after wet heat aging.

Further, if the amount of the terminal blocking agent is 0.1% by mass or more, it is possible to accomplish the improvement of weather resistance due to an effect of reducing the terminal carboxylic acid amount AV of the polyester in the polyester support, and thus to provide low thermal shrinking properties. On the other hand, if the amount of the terminal blocking agent is 2% by mass or less, reduction of the glass transition temperature (Tg) of the polyester by the addition of the terminal blocking agent can be inhibited, and correspondingly, the reduction of weather resistance or the increase in the thermal shrinkage can be inhibited. This is due to a fact that the increase in the hydrolysis properties caused by a relative increase in the reactivity of the polyester due to the reduction of Tg is inhibited, or the thermal shrinkage caused by the promoted increase in the mobility of the polyester molecules increased by the reduction of Tg is inhibited.

In addition, in the case where a polyester support is produced by diluting a master batch (which is also referred to as a master pellet), an terminal blocking agent master batch including an terminal blocking agent at a high concentration may be produced and used.

The melting point of the terminal blocking agent is preferably from 110° C. to 230° C., more preferably from 110° C. to 200° C., and particularly preferably from 110° C. to 180° C.

In addition, the melt flow rate (which is hereinafter also referred to as MFR) of the terminal blocking agent is a value measured with a load of 2160 g at a melting point of the terminal blocking agent +10° C. The value is preferably from 2 g to 30 g, more preferably from 2 g to 25 g, and particularly preferably from 4 g to 25 g.

The weight average molecular weight of the terminal blocking agent is preferably from 3000 to 50000, more preferably from 10000 to 40000, and particularly preferably from 15000 to 30000. With these ranges, there is an effect that the molecular weight of the terminal blocking agent is large, and the entanglement with other polyester molecules is generated to increase the intermolecular interaction. In order to exhibit such an effect, a high molecular weight of 10000 or more is preferred. If the molecular weight is at most the upper limit of the molecular weight range, the mobility (reactivity) of the terminal blocking agent is improved and the reaction (sealing) with the polyester terminal becomes easier. On the other hand, if the molecular weight is at least the lower limit of the molecular weight range, the effect of entanglement with other polyester molecules is easily exhibited and the physical properties of obtained polyester support can be improved.

The terminal blocking agent contained in the polyester support is not particularly limited, and examples thereof include compounds containing a carbodiimide group, an epoxy group, an oxazoline group, or a hydroxyl group. Above all, in the back protective sheet for a solar cell module of the present invention is preferably a compound, the terminal blocking agent is preferably a compound having a carbodiimide group or an epoxy group, and particularly preferably a compound having a carbodiimide group, which provides high reactivity. The terminal blocking agents may be used singly or in combination of two or more kinds thereof.

As the compound having a carbodiimide group, a polycarbodiimide is preferred, from the viewpoints of volatility and reactivity.

The polycarbodiimide is a compound having a structure (a carbodiimido group) represented by (—N=C=N—), and can be produced, for example, by heating an organic isocyanate, in the presence of an appropriate catalyst, to perform a decarboxylation reaction. As the weight average molecular weight of the polycarbodiimide, a weight average molecular weight in terms of polystyrene standards may be used, which is obtained by dissolving polycarbodiimide powder in a solvent selected from chloroform, tetrahydrofuran (THF), N-methyl-2-pyrrolidone (NMP), and hexafluoroisopropanol (HFIP), and measuring the curve of the molecular weight distribution curve using GPC.

The polycarbodiimide compound can be selected from compounds obtained by the polymerization of aliphatic diisocyanate, alicyclic diisocyanate, aromatic diisocyanate, or a mixture thereof. Specific examples thereof include polymers such as 1,5-naphthalenecarbodiimide, 4,4'-diphenylmethanecarbodiimide, 4,4'-diphenyldimethylmethanecarbodiimide, 1,3-phenylenecarbodiimide, 1,4-phenylenediisocyanate, 2,4-tolylenecarbodiimide, 2,6-tolylenecarbodiimide, a mixture of 2,4-tolylenecarbodiimide and 2,6-tolylenecarbodiimide, hexamethylenecarbodiimide, cyclohexane-1,4-carbodiimide, xylenecarbodiimide, isophoronecarbodiimide, isophoronecarbodiimide, dicyclohexyl methane-4,4'-carbodiimide, methylcyclohexanecarbodiimide, tetramethylxylenecarbodiimide, 2,6-diisopropylphenylcarbodiimide, 1,3,5-triisopropylbenzene-2,4-carbodiimide, and the like.

As the polycarbodiimide, among those, a compound obtained by the polymerization of aromatic diisocyanates is preferred, and a polycarbodiimide having a unit structure represented by formula (2) is preferred.

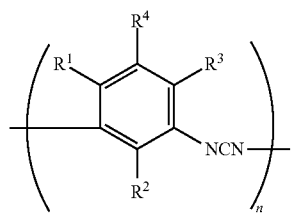

Formula (2)

$R^1$, $R^2$, $R^3$, and $R^4$ each independently represent an alkyl group having 1 to 7 carbon atoms or a hydrogen atom. n represents the number of recurring units.

As the polycarbodiimide having a unit structure represented by the formula (2), which is obtained by polymerizing aromatic diisocyanates, among those, in particular, a polymer of 2,6-diisopropylphenylcarbodiimide, and a polymer of 1,3,5-triisopropylbenzene-2,4-carbodiimide, and copolymers of the respective polymers can be preferably used. Further, as a commercially available product thereof, "STABAXOL" manufactured by Rhein Chemie Japan Ltd., or the like can be used. Specific examples thereof include STABAXOL P (molecular weight of 3000 to 4000, manufactured by Rhein Chemie Japan Ltd.), LA-1 (molecular weight of about 2000, manufactured by Nisshinbo Chemicals, Inc.), STABAXOL P400 (molecular weight of about 20000, manufactured by Rhein Chemie Japan Ltd.), and STABILIZER 9000 (molecular weight of about 20000, manufactured by Rhein Chemie Corp.).

The polycarbodiimide can be synthesized by heating diisocyanate (for example, 2,4,6-triisopropylphenyl 1,3-dicyanate) and phospholene oxide (for example, 3-methyl-1-phenyl-2-phospholene oxide). The weight average molecular weight of polycarbodiimide can be controlled by selecting the addition amount of the respective materials or the reaction time.

In the back protective sheet for a solar cell module of the present invention, the terminal blocking agent is preferably a polycarbodiimide having a molecular weight of 3000 to 50000, more preferably a polycarbodiimide having a molecular weight of 10000 to 40000, and particularly preferably a polycarbodiimide having a molecular weight of 15000 to 30000. If the molecular weight of the terminal blocking agent is at least the lower limit of the range, the volatilization amount is not increased too much, and thus, it becomes easy to attain stable production. If the molecular weight of the terminal blocking agent is at most the upper limit of the range, the reactivity is not decreased, and thus, the effect can be sufficiently expected.

On the other hand, preferred examples of the epoxy compound include a glycidyl ester compound, a glycidyl ether compound, and the like.

Specific examples of the glycidyl ester compounds include glycidyl benzoate, glycidyl t-Bu-benzoate, glycidyl p-toluate, glycidyl cyclohexanecarboxylate, glycidyl pelargonate, glycidyl stearate, glycidyl laurate, glycidyl palmitate, glycidyl behenate, glycidyl versatate ester, glycidyl oleate, glycidyl linoleate, glycidyl linolenate, glycidyl behenolate, glycidyl stearolate, diglycidyl terephthalate, diglycidyl isophthalate, diglycidyl phthalate, diglycidyl naphthalene dicarboxylate, diglycidyl methyl terephthalate, diglycidyl hexahydrophthalate, diglycidyl tetrahydrophthalate, diglycidyl cyclohexane dicarboxylate, diglycidyl adipate, diglycidyl succinate, diglycidyl sebacate, diglycidyl dodecane diolate, diglycidyl octadecane dicarboxylate, triglycidyl trimellitate, tetraglycidyl pyromellitate, and the like, and these can be used singly or in combination of two or more kinds thereof.

Further, specific examples of the glycidyl ether compound include phenyl glycidyl ether, o-phenyl glycidyl ether, 1,4-bis(β,γ-epoxypropoxy)butane, 1,6-bis(β,γ-epoxypropoxy)hexane, 1,4-bis(β,γ-epoxypropoxy)benzene, 1-(β,γ-epoxypropoxy)-2-ethoxyethane, 1-(β,γ-epoxypropoxy)-2-benzyl oxyethane, 2,2-bis[p-(β,γ-epoxypropoxy)phenyl]propane, and bisglycidyl polyethers obtainable by reaction of bisphenols such as 2,2-bis(4-hydroxyphenyl)propane and 2,2-bis(4-hydroxyphenyl)methane and the like with epichlorohydrin, and these can be used singly or in combination of two or more kinds thereof.

In addition, as the oxazoline compound, a bisoxazoline compound is preferred, and specific examples thereof include 2,2'-bis(2-oxazoline), 2,2'-bis(4-methyl-2-oxazoline), 2,2'-bis(4,4-dimethyl-2-oxazoline), 2,2'-bis(4-ethyl-2-oxazoline), 2,2'-bis(4,4'-diethyl-2-oxazoline), 2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cyclohexyl-2-oxazoline), 2,2'-bis(4-benzyl-2-oxazoline), 2,2'-p-phenylenebis(2-oxazoline), 2,2'-m-phenylenebis(2-oxazoline), 2,2'-o-phenylenebis(2-oxazoline), 2,2'-p-phenylenebis(4-methyl-2-oxazoline), 2,2'-p-phenylenebis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'-octamethylenebis(2-oxazoline), 2,2'-decamethylenebis(2-oxazoline), 2,2'-ethylenebis(4-methyl-2-oxazoline), 2,2'-tetramethylenebis(4,4-dimethyl-2-oxazoline), 2,2'-9,9'-diphenoxyethanebis(2-oxazoline), 2,2'-cyclohexylenebis(2-oxazoline), 2,2'-diphenylenebis(2-oxazoline), and the like.

(Other Additives to Polyester Support)

Further, within a range not interfering with the effects of the present invention, various additives, for example, a compatibilizer, a plasticizer, a weathering agent, an antioxidant, a thermal stabilizer, a lubricant, an antistatic agent, a brightener, a colorant, a conductive agent, an ultraviolet absorber, a flame retardant, a flame retardant auxiliary agent, a dye, or the like may be added to the polyester support.

(Method for Forming Polyester Support)

The polyester support in the present invention is preferably a biaxially-stretched film that is prepared by melt-extruding the above-mentioned polyester into a film, then cooling and solidifying the film on a casting drum to be an unstretched film, stretching the unstretched film at Tg to (Tg+60)° C. in the machine direction once or more to a total draw ratio of from 3 times to 6 times, and thereafter further stretching it in the cross direction at Tg to (Tg+60)° C. to a draw ratio of from 3 to 5 times.

Further, the polyester support in the present invention is preferably one formed by carrying out a heat-treatment after stretching, from the viewpoint of improving the hydrolysis resistance and controlling the thermal shrinkage. The heat treatment is carried out at preferably from 150° C. to 230°

C., more preferably from 180° C. to 225° C., and even more preferably from 190° C. to 215° C. Further, the heat treatment time is preferably from 5 seconds to 60 seconds, more preferably from 10 seconds to 40 seconds, and even more preferably from 10 seconds to 30 seconds.

The polyester support in the present invention is preferably one formed by carrying out thermal relaxation after stretching from the viewpoint of controlling the thermal shrinkage. The thermal relxation is preferably from 1% to 10%, more preferably from 3% to 7%, and particularly preferably from 4% to 6% in the MD direction. Further, the thermal relaxation is preferably from 3% to 20%, more preferably from 6% to 16%, and particularly preferably from 8% to 13% in the TD direction.

In addition, the thermal relaxation ratio in the MD and TD directions may be independently controlled by using a simultaneous double-screw stretcher or by the use of an MD-contractible TD stretcher. Consequently, the thermal shrinkage of the polyester support can be controlled so as to fall within a different range in the first direction and in the second direction.

Preferred is an embodiment in which the polyester support is surface-treated in any mode of a corona treatment, a flame treatment, a low-pressure plasma treatment, an atmospheric pressure plasma treatment, or a ultraviolet treatment. Such a surface treatment given to the surface of support to be coated but before being coated with a polymer layer thereon may further enhance the adhesiveness of the support to the coating layer in exposure to a wet heat environment. Above all, in particular, the corona treatment is carried out to obtain a more excellent effect of improving the adhesiveness.

Such a surface treatment increases the carboxyl groups and the hydroxyl groups existing in the surface of the polyester support, whereby the adhesiveness of the polyester support to the coating layer can be enhanced, but in the case where the surface treatment is used in combination with a crosslinking agent (particularly an oxazoline-based or carbodiimide-based crosslinking agent having high reactivity with a carboxyl group), then more powerful adhesiveness can be obtained. This is more remarkable in the case of a corona treatment. Accordingly, it is preferable that the surface of the polyester support on which a polymer layer is formed be corona-treated.

<Polymer Layer Arranged to be in Contact with Polyester Support>

The back protective sheet for a solar cell module of the present invention has a polymer layer arranged to be in contact with at least one surface of the polyester support, in which the polymer layer contains a binder having at least one functional group selected from a carboxyl group, a hydroxyl group, an amino group, a sulfonic acid group, and a carbonyl group, a pigment, and a crosslinking agent-derived structure.

In the back protective sheet for a solar cell module of the present invention, the polymer layer arranged to be in contact with at least one surface of the polyester support that is biaxially stretched and then subjected to a thermal fixation treatment is laminated without use of an adhesive interposed between the polyester support and the polymer layer as described above. Here, a method in which the polymer layer is formed on the polyester support that is biaxially stretched and then subjected to a thermal fixation treatment is not particularly limited, but the formation of a polymer layer can be carried out by a method in which a material for the polymer layer is stuck on a polyester support, a method in which a polymer layer is coextruded during the formation of a polyester support, a method involving coating, or the like. In the case where a step of forming the polymer layer is a step of coating a polymer layer-forming coating liquid on at least one surface of a polyester support that is biaxially stretched and then subjected to a thermal fixation treatment and drying the coated film, it is preferable that the obtained coated film be not further stretched. That is, in the present invention, since a polyester support that is biaxially stretched and then subjected to a thermal fixation treatment is used, it is not necessary to carry out stretching after the formation of a polymer layer, and thus, the film thickness of the obtained polymer layer can be increased.

The film thickness of the obtained polymer layer is preferably from 1 μm to 20 μm more preferably from 3 μm to 17 μm, and particularly preferably from 5 μm to 15 μm.

(Arrangement of Polymer Layer Arranged to be in Contact with Polyester Support)

The polymer layer arranged to be in contact with the polyester support provides improved adhesiveness to the polyester support (including the adhesiveness to a sealing material provided on a substrate on the side of a cell) after wet heat aging, and further, a polymer layer having wet heat resistant storage is formed, and therefore, when the polymer layer is adhered onto a solar cell module, it is preferably used as a layer exposed in a more outer environment than the polyester support, that is, as a back layer. Here, in a solar cell having a laminated structure of a transparent front substrate (glass substrate or the like)/a sealing material/a photovoltaic cell-containing element structure part/a sealing material/a back protective sheet for a solar cell, on the side on which sunlight is incident, the back layer is a back protective layer arranged on the side opposite to an element structure part including the photovoltaic cell of the polyester support, and may be either a structure with one layer or a structure with a lamination of two or more layers. An outermost layer of the back layer may be formed along the polymer layer arranged to be in contact with the polyester support, and another outermost layer may be further formed on the polymer layer arranged to be in contact with the polyester support.

Furthermore, in the case where the polymer layer arranged to be in contact with the polyester support constitutes a solar cell module as a back layer, it is preferable that a composite polymer as described later be contained as a binder. In an embodiment in which the composite polymer as described later is contained, the adhesion to the polyester support after wet heat aging is improved and further, resistance to deterioration under a wet heat environment is obtained.

(Components of Polymer Layer Arranged to be in Contact with Polyester Support)

The polymer layer arranged to be in contact with the polyester support contains a binder having at least one functional group selected from a carboxyl group, a hydroxyl group, an amino group, a sulfonic acid group, and a carbonyl group, a pigment, and a crosslinking agent-derived structure.

—Binder—

The binder having at least one functional group selected from a carboxyl group, a hydroxyl group, an amino group, a sulfonic acid group, and a carbonyl group, which is used in the polymer layer arranged to be in contact with the polyester support, is not particularly limited, but a known binder may be used.

In the back protective sheet for a solar cell module of the present invention, the binder contained in the polymer layer is preferably a water-based latex.

The water-based latex means a state in which polymers are dispersed at a content of water in the solvent of 80% or more. The water-based latex is not particularly limited in the kind or the like, but preferred examples thereof include composite polymers containing a recurring portion of a siloxane structural unit represented by the following formula (1), and a recurring portion of a non-siloxane structural unit copolymerizable with the recurring portion in the molecule as described later. Other examples thereof include polyester polyols or polyacryl polyols, and preferred examples of the binder include polyacryl polyol resins (for example, JURYMER ET-410 and SEK-301, both manufactured by TOAGOSEI Co., Ltd.), polyester polyols (for example, VYLONAL MD-1480 and MD-15001, both manufactured by TOYOBO Co., Ltd.), and the like.

Here, in the water-based polymer latex, water only is preferably used as a dispersion medium, but water may be mainly contained as the dispersion medium and organic solvents may also be contained within a range not departing from the subject matter of the present invention. Examples of the organic solvent include methanol, ethanol, n-butyl alcohol, isopropyl alcohol, and n-butyl cellosolve, and isopropyl alcohol and n-butyl cellosolve are preferred. The content of the organic solvent in the dispersion medium is preferably 20% by weight or less. The composition for forming a water-based latex layer preferably includes 20% by weight to 50% by weight of a hydrophobic polymer material, and 80% by weight to 50% by weight of a water-based dispersion medium. Further, the composition may also contain other components.

The polymer layer arranged to be in contact with the polyester support in the present invention preferably includes a composite polymer (which may be hereinafter also abbreviated as a composite polymer in some cases) containing a recurring portion of a siloxane structural unit represented by the following formula (1), and a recurring portion of a non-siloxane structural unit copolymerizable with the recurring portion in the molecule, and more preferably includes a composite polymer containing a recurring portion of a siloxane structural unit represented by the following formula (1) in an amount of 15% by mass to 99% by mass, and a recurring portion of a non-siloxane structural unit copolymerizable with the recurring portion in an amount of 85% by mass to 1% by mass in the molecule.

$$—(Si(R^1)(R^2)—O)_n— \quad \text{Formula (1)}$$

In the formula (1), $R^1$ and $R^2$ each independently represent a hydrogen atom, a halogen atom, or a monovalent organic group capable of covalent-bonding to an Si atom, and n represents a natural number. In the case where n is 2 or more, a plurality of $R^1$ and $R^2$ may be the same as or different from each other.

By incorporating such a composite polymer, it is possible to improve the adhesion to a polyester support that is a support after wet heat aging, the adhesiveness between the layers or to a substrate on the side of a cell (in particular, a sealing material such as EVA and the like), that is, to remarkably improve the peeling resistance and shape stability, which may be easily deteriorated when heat or moisture is provided. Further, such a specific composite polymer in the case where it contains a recurring portion of a non-siloxane-based structural unit in an amount of 85% by mass to 1% by mass is a polymer different from a silicone-based adhesive used in the related art. In addition, in the composite polymer, the recurring portion of the siloxane structural unit represented by the formula (1) and the recurring portion to be copolymerized may be each one kind or a combination of two or more kinds thereof.

"$—(Si(R^1)(R^2)—O)_n—$" is a (poly)siloxane segment derived from various (poly)siloxanes having a linear, branched, or cyclic structure.

Examples of the halogen atom represented by $R^1$ and $R^2$ include a fluorine atom, a chlorine atom, an iodine atom, and the like.

The "monovalent organic group" represented by $R^1$ and $R^2$ is a group capable of covalent-bonding to the Si atom, and may be unsubstituted or may have a substituent. Examples of the monovalent organic group include an alkyl group (for example, a methyl group, an ethyl group, and the like), an aryl group (for example, a phenyl group and the like), an aralkyl group (for example, a benzyl group, a phenylethyl group, and the like), an alkoxy group (for example, a methoxy group, an ethoxy group, a propoxy group, and the like), an aryloxy group (for example, a phenoxy group and the like), a mercapto group, an amino group (for example, an amino group, a diethylamino group, and the like), an amide group, and the like.

Further, in the composite polymer, at least one functional group selected from a carboxyl group, a hydroxyl group, an amino group, a sulfonic acid group, and a carbonyl group may be contained in either the recurring portion of the siloxane structural unit represented by the formula (1) or the recurring portion of the non-siloxane-based structural unit. Above all, in the composite polymer, at least one functional group selected from a carboxyl group, a hydroxyl group, an amino group, a sulfonic acid group, and a carbonyl group is preferably contained in the recurring portion of a non-siloxane-based structural unit. That is, in the composite polymer, the "monovalent organic group" represented by $R^1$ and $R^2$ may not have at least one functional group selected from a carboxyl group, a hydroxyl group, an amino group, a sulfonic acid group, and a carbonyl group.

In the back protective sheet for a solar cell module of the present invention, it is preferable that both of $R^1$ and $R^2$ of the recurring portion of the siloxane structural unit represented by the formula (1) in the composite polymer be at least one selected from an alkyl group, an aryl group, an aralkyl group, an alkoxy group, an aryloxy group, a mercapto group, an amino group, and an amide group.

Above all, from the viewpoint of the adhesiveness of the polymer layer to the adjacent material such as the polyester support and the like, and the durability thereof in a wet heat environment, it is preferable that $R^1$ and $R^2$ be each independently an unsubstituted or substituted alkyl group having 1 to 4 carbon atoms (particularly a methyl group or an ethyl group), an unsubstituted or substituted phenyl group, an unsubstituted or substituted alkoxy group, a mercapto group, an unsubstituted amino group, or an amide group; and from the viewpoint of the durability in a wet heat environment, more preferred is an unsubstituted or substituted alkoxy group (preferably an alkoxy group having 1 to 4 carbon atoms).

n is preferably from 1 to 5000, and more preferably from 1 to 1000.

The proportion of the moiety of "$—(Si(R^1)(R^2)—O)_n—$" (the (poly)siloxane structural unit represented by the formula (1)) in the composite polymer is preferably from 15% by mass to 99% by mass, more preferably from 25% by mass to 85% by mass, even more preferably from 25% by mass to 50% by mass, and particularly preferably from 25% by mass to 35% by mass, with respect to the total mass of the composite polymer. If the proportion of the (poly)siloxane structural unit is 15% by mass or more, the film strength of the surface of the polymer layer is high and therefore the layer can be prevented from having flaws owing to scratching, abrasion, or collision with small flying stones, or the like, and further, the adhesiveness to the polyester support is excellent. Since the polymer layer is prevented from generation of flaws, the weather resistance thereof may be enhanced, and the peeling resistance that may often be deteriorated when exposed to heat or moisture, the shape stability, and the adhesion durability in exposure to a wet heat environment can be effectively enhanced. Further, if the proportion of the (poly)siloxane structural unit is 85% by mass or less, the coating liquid can be maintained stable in forming the polymer layer arranged to be in contact with the polyester support by coating, and thus the surface shape of the obtained polymer layer is improved. The proportion of the (poly)siloxane structural unit is preferably 50% by mass or less from the viewpoint of the production cost.

The copolymerization polymer is preferably a block copolymer produced through the copolymerization of a siloxane compound (including a polysiloxane) and a compound selected from a non-siloxane-based monomer or a non-siloxane-based polymer and having a (poly)siloxane structural unit represented by the formula (1) and a non-siloxane-based structural unit. In this case, the siloxane compounds and the non-siloxane-based monomers or non-siloxane polymers to be copolymerized may be one kind or a combination of two or more kinds thereof.

Furthermore, the non-siloxane-based structural unit (a structural portion derived from a non-siloxane-based monomer or a non-siloxane-based polymer) to be copolymerized with the siloxane structural unit is not particularly limited except that it does not have a siloxane structure, and may be any one of polymer segments derived from any polymer. Examples of the polymer (prepolymer) that is a precursor of the polymer segment include various polymers such as a vinyl polymer, a polyester polymer, a polyurethane polymer, and the like. A vinyl polymer and a polyurethane polymer are preferred from the viewpoint that they are easy to prepare and are excellent in hydrolysis resistance; and a vinyl polymer is particularly preferred.

Typical examples of the vinyl-based polymer include various polymers such as an acrylic polymer, a vinyl carboxylate-based polymer, an aromatic vinyl-based polymer, a fluoro-olefin-based polymer, and the like. Above all, an acrylic polymer (that is, an acrylic structural unit as a non-siloxane-based structural unit) is particularly preferred from the viewpoint of the planning latitude thereof. That is, in the back protective sheet for a solar cell module of the present invention, the composite polymer in the polymer layer is preferably a composite polymer containing a silicone resin and an acrylic resin.

In the back protective sheet for a solar cell module of the present invention, the binder contained in the polymer layer is preferably a binder having a carboxyl group, more preferably the composite polymer having a carboxyl group in the recurring portion of a non-siloxane-based structural unit, and particularly preferably the composite polymer having a carboxyl group in a recurring portion of an acrylic structural unit.

In addition, the polymers constituting the non-siloxane-based structural unit may be one kind or a combination of two or more kinds.

Moreover, the prepolymer constituting the non-siloxane-based structural unit is preferably one containing at least one of an acid group and a neutralized acid group and/or a hydrolyzable silyl group. Among these prepolymers, a vinyl-based polymer may be prepared according to various methods, for example, according to (1) a method of copolymerizing an acid group-containing vinyl-based monomer and a vinyl-based monomer containing a hydrolyzable silyl group and/or a silanol group, along with a monomer copolymerizable with these, (2) a method of reacting a previously-prepared vinyl-based polymer that contains a hydroxyl group as well as a hydrolyzable silyl group and/or a silanol group, with a polycarboxylic acid anhydride, (3) a method of reacting a previously-prepared vinyl-based polymer that contains an acid anhydride group as well as a hydrolyzable silyl group and/or a silanol group, with a compound having active hydrogen (water, alcohol, amine, or the like), and the like.

Such a prepolymer may be produced and obtained, for example, using the method described in the paragraph Nos. [0021] to [0078] in JP-A-2009-52011.

The polymer layer in the present invention may use, as a binder, the composite polymer singly or in combination with other polymers. In the case where the binder is used in combination with the other polymer, the proportion of the composite polymer in the present invention is 30% by mass or more, and more preferably 60% by mass or more of the entire binder. When the proportion of the composite polymer is 30% by mass or more, the adhesiveness to the polyester support and the durability thereof in a wet heat environment is more excellent.

The molecular weight of the composite polymer is preferably from 5,000 to 100,000, and more preferably from 10,000 to 50,000.

For the preparation of the composite polymer, various methods such as (i) a method of reacting the prepolymer with a polysiloxane having a structural unit represented by the above-mentioned formula (1) [—(Si($R^1$)($R^2$)—O)$_n$—], and (ii) a method of hydrolyzing and condensing a silane compound having a structural unit represented by [—(Si($R^1$)($R^2$)—O)$_n$—] in which $R^1$ and/or $R^2$ each are a hydrolyzable group, in the presence of the prepolymer can be used.

Examples of the silane compounds used in the method (ii) include various silane compounds, but alkoxysilane compounds are particularly preferred.

In the case where the composite polymer is prepared by the method (i), for example, the composite polymer can be prepared by optionally adding water and a catalyst to a mixture of the prepolymer and the polysiloxane, and reacting the mixture at a temperature of from about 20° C. to 150° C. for from about 30 minutes to 30 hours (preferably at 50° C. to 130° C. for 1 hour to 20 hours). As the catalyst, various silanol condensation catalysts such as an acid compound, a basic compound, and a metal-containing compound, or the like can be added.

In addition, in the case where the composite polymer is prepared according to the method (ii), for example, the composite polymer can be prepared by adding water and a silanol condensation catalyst to a mixture of the prepolymer and the alkoxysilane compound, and reacting the mixture for hydrolytic condensation at a temperature of from about 20° C. to 150° C. for from about 30 minutes to 30 hours (preferably at 50° C. to 130° C. and for 1 hour to 20 hours).

Moreover, as the composite polymer having a (poly)siloxane structure, commercially-available products may be used, and for example, CERANATE series (for example, CERANATE WSA1070, CERANATE WSA1060, and the like), manufactured by DIC Corp., H7600 series (H7650, H7630, H7620, and the like) manufactured by Asahi Kasei Chemicals, Ltd., inorganic/acrylic composite emulsions manufactured by JSR, or the like can be used.

The content ratio of the composite polymer in the polymer layer is preferably in a range of from 0.2 g/m$^2$ to 15 g/m$^2$.

If the content ratio of the composite polymer is 0.2 g/m² or more, the content of the composite polymer can be enough to enhance the scratching resistance of the polymer layer. If the content ratio of the composite polymer is 15 g/m² or less, the amount of the composite polymer is not too much and therefore the polymer layer can be sufficiently cured.

Within the above range, the content is preferably from 0.5 g/m² to 10.0 g/m², and more preferably from 1.0 g/m² to 10.0 g/m², from the viewpoint of the surface strength of the polymer layer.

—Pigment—

The polymer layer in the present invention further contains a pigment, in addition to the silicone-based polymer. By incorporating a pigment in the polymer layer, the adhesiveness to the polyester support after wet heat aging can be further improved.

As the pigment, a white pigment is preferably contained from the viewpoint of the light-reflecting function of the layer and of the improvement of the lightfastness. Further, the white pigment may also have the function of the ultraviolet absorber.

As the white pigment, preferred is an inorganic pigment such as titanium dioxide, barium sulfate, silicon oxide, aluminum oxide, magnesium oxide, calcium carbonate, kaolin, talc, and the like, or an organic pigment such as hollow particles and the like.

The function of the white pigment-containing layer is, first, to reflect the moiety of the incident light having passed through the photovoltaic cell and having reached the back sheet not used for power generation, to bring back it to the photovoltaic cell thereby increasing the power generation efficiency of a solar cell module, and secondly, to improve the decorativeness of the outward appearance of a solar cell module when seen from the side thereof on which sunlight falls (front side), or the like. In general, when a solar cell module is seen from the front side thereof, the back sheet is seen in the periphery of the photovoltaic cell, and by providing a white pigment-containing layer in the back sheet, the decorativeness of the resulting module can be improved and the appearance of the module can thereby be improved.

By further incorporating a white pigment to the polymer layer, in addition to the silicone-based polymer, the reflectance of the back protective sheet for a solar cell module can be increased and the yellowing of the sheet in a long-term high-temperature high-humidity test (for 2000 hours to 4000 hours at 85° C. and a relative humidity of 85%) and in a UV irradiation test (to a total dose of 45 Kwh/m² according to the UV test of IEC 61215) can be reduced.

In the back protective sheet for a solar cell module of the present invention, the content of the white pigment contained in the polymer layer is preferably from 0.1 g/m² to 15 g/m² per one polymer layer. If the content of the white pigment is 0.1 g/m² or more, the layer can effectively provide good reflectance and UV resistance (lightfastness). On the other hand, if the content of the white pigment in the polymer layer is 15 g/m² or less, the surface shape of the color layer can be maintained satisfactorily with ease and the film strength thereof can be excellent. Above all, it is more preferable that the content of the white pigment contained in the polymer layer fall within a range of from 1.0 g/m² to 10 g/m², and particularly preferably from 3 g/m² to 8.5 g/m² per one polymer layer.

The average particle diameter of the white pigment is preferably from 0.03 μm to 0.8 μm, and more preferably from about 0.15 μm to 0.5 μm as the volume average particle diameter thereof. If the average particle diameter falls within the range, the light reflectance of the layer can be high. The average particle diameter is a value measured with a laser analyzing/scattering particle sizer LA950 (manufactured by Horiba Seisakusho Corp.).

In the case where the polymer layer has the white pigment, the light reflectance at 550 nm on the surface (outermost surface) on the side of the polymer layer on which the white pigment is arranged is preferably 75% or more, more preferably 80% or more, and particularly preferably 90% or more. Further, the light reflectance is as follows: in the case where the back protective sheet for a solar cell module of the present invention is used as a back sheet for a solar cell and when the incident light toward the sealing material side of a solar cell module is reflected on the polymer layer and again goes out from the sealing material side of the solar cell module, the ratio of the amount of the incident light to the amount of the outgoing light indicates the light reflectance. Here, a light having a wavelength of 550 nm is used as a typical wavelength light.

If the light reflectance is 75% or more, the incident light having passed through the cell and having gone inside can be effectively brought back to the cell, and the power generation efficiency-improving effect can be large. By controlling the content of the white pigment to be, for example, within a range of from 2.5 g/m² to 30 g/m², the light reflectance can be adjusted to be 75% or more.

The content of the binder component (including the composite polymer) in the polymer layer is preferably in a range of from 15% by mass to 200% by mass, and more preferably in a range of from 17% by mass to 100% by mass, with respect to the white pigment. If the content of the binder is 15% by mass or more, the strength can be obtained sufficiently; and if the content is 200% by mass or less, the reflectance and the decorativeness of the layer can be maintained satisfactorily.

On the other hand, the back protective sheet for a solar cell module of the present invention preferably contains a black pigment in the polymer layer from the viewpoint of improving the decorativeness in appearance of the solar cell module. Further, preferred is also a configuration in which a combination of a white pigment and a black pigment is used as a pigment to be added to the polyester support and the polymer layer, to make it easy to identify the front from the back, thereby enhancing the productivity of the solar cell module thus produced.

Examples of the black pigment include carbon black and the like.

Carbon black is preferably contained in the polymer layer in an amount of 10% by mass to 100% by mass with respect to the total binder in the polymer layer. By using the amount of carbon black to be added in such a range, it is possible to improve the adhesiveness of the polymer layer to the polyester support after wet heat aging, as compared with that before wet heat aging.

Carbon black is more preferably contained in the polymer layer in an amount of 20% by mass to 80% by mass, and more preferably of 35% by mass to 75% by mass with respect to the binder. The content of carbon black in a range of at least the lower limit of the range is preferred from the viewpoint of providing blackness sufficiently, and the content of carbon black in a range of at most the upper limit of the range is preferred from the viewpoint of improving the surface shape.

Carbon black is preferably a carbon black fine particle having a particle diameter of 0.1 μm to 0.8 μm. Further, it is preferable to use a dispersion formed by dispersing fine carbon black particles in water together with a dispersant.

Further, as the carbon black, a commercially available one can be used, and for example, MF-5630 Black (manufactured by Dainichiseika Color & Chemicals Mfg. Co., Ltd.), those described in paragraph No. [0035] of JP-A-2009-132887, or the like can be used.

—Crosslinking Agent—

In the back protective sheet for a solar cell module of the present invention, the polymer layer arranged to be in contact with the polyester support has a crosslinking agent-derived structure. By adding a crosslinking agent to a binder (binding resin) usually constituting the polymer layer to form the polymer layer, a crosslinking agent-derived crosslinked structure is obtained.

Examples of the crosslinking agent include an epoxy-based crosslinking agent, an isocyanate-based crosslinking agent, a melamine-based crosslinking agent, a carbodiimide-based crosslinking agent, an oxazoline-based crosslinking agent, and the like. Among these, a carbodiimide-based crosslinking agent and an oxazoline-based crosslinking agent are preferred.

Specific examples of the oxazoline-based crosslinking agent include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl-2-oxazoline), 2,2'-p-phenylene-bis-(2-oxazoline), 2,2'-m-phenylene-bis(2-oxazoline), 2,2'-m-phenylene-bis-(4,4'-dimethyl-2-oxazoline), bis-(2-oxazolinylcyclohexane) sulfide, bis-(2-oxazolinylnorbornane) sulfide, and the like. Further, (co)polymers of those compounds are also preferably used.

Specific examples of the carbodiimide-based crosslinking agent include dicyclohexylmethane carbodiimide, tetramethylxylylene carbodiimide, dicyclohexylmethane carbodiimide, and the like. Also, the carbodiimide compounds described in JP-A-2009-235278 are also preferred.

Specific examples of the carbodiimide-based and oxazoline-based crosslinking agents are as follows. Examples of the carbodiimide-based crosslinking agent include Carbodilite SV-02, Carbodilite V-02, Carbodilite V-02-L2, Carbodilite V-04, Carbodilite E-01, and Carbodilite E-02 (all manufactured by Nisshinbo Chemical Inc.), and examples of the oxazoline-based crosslinking agent include Epocross K2010E, Epocross K2020E, Epocross K2030E, Epocross WS-500, and Epocross WS-700 (all manufactured by Nippon Shokubai Co., Ltd.), and the like.

In the back protective sheet for a solar cell module of the present invention, the crosslinking agent-derived component of the polymer layer is preferably a component derived from at least one crosslinking agent selected from an oxazoline-based crosslinking agent and a carbodiimide-based crosslinking agent.

In the back protective sheet for a solar cell module of the present invention, at least one of the polymer layer and the fluorine-containing polymer layer contains the crosslinking agent-derived component in an amount of preferably 3% by mass to 30% by mass, more preferably 3% by mass to 25% by mass, and particularly preferably 5% by mass to 20% by mass, with respect to the total binder in each of the polymer layer. If the amount of the crosslinking agent to be added is 3% by mass or more, a sufficient crosslinking effect can be obtained while the strength and the adhesiveness of the polymer layer after wet heat aging can be maintained; and if the amount is 25% by mass or less, a long pot life of the coating liquid can be maintained.

—Components Other Than Polymer Layer—

The other components capable of being contained in the polymer layer arranged to be in contact with the polyester support include an ultraviolet absorber, a surfactant, a filler, and the like.

Examples of the ultraviolet absorber include a compound which is converted into heat energy by absorbing ultraviolet light, a material which captures radicals generated while a film or the like absorbs ultraviolet light and decomposes, thus to inhibit the decomposition and chain reactions, and the like. By containing these compounds, even in the case where being continuously placed in the exposure to light for a long period of time, strength deterioration, peeling, color changes, and the like are prevented.

By way of examples of the ultraviolet absorber, examples of the organic ultraviolet absorber include ultraviolet absorbers such as a salicylate-based ultraviolet absorber, a benzophenone-based ultraviolet absorber, a benzotriazole-based ultraviolet absorber, a cyanoacrylate-based ultraviolet absorber, a triazine-based ultraviolet absorber, and the like; an ultraviolet stabilizer such as a hindered amine-based ultraviolet absorber; and the like.

In addition, examples of the inorganic ultraviolet absorber include fine particles of titanium oxide, cerium oxide, and the like.

The content of the ultraviolet absorber in the polymer layer is preferably in a range of from 2 $g/m^2$ to 15 $g/m^2$, more preferably in a range of from 4 $g/m^2$ to 12 $g/m^2$, and particularly preferably in a range of from 5 $g/m^2$ to 10 $g/m^2$.

As the surfactant, any known surfactants such as an anionic surfactant, a nonionic surfactant, and the like can be used. In the case where such a surfactant is added, the addition amount thereof is preferably from 0.1 $mg/m^2$ to 10 $mg/m^2$, and more preferably from 0.5 $mg/m^2$ to 3 $mg/m^2$. If the amount of the surfactant to be added is 0.1 $mg/m^2$ or more, a good layer can be formed while preventing generation of cissing, while if the amount is 10 $mg/m^2$ or less, the adhesion of the layer to the polyester support and to the fluorine-containing polymer layer can be carried out well.

A filler may be further added to the polymer layer. As the filler, any known fillers such as colloidal silica, titanium dioxide, and the like can be used.

The amount of the filler to be added is preferably 20% by mass or less, and more preferably 15% by mass or less, with respect to the binder in the polymer layer. If the amount of the filler to be added is 20% by mass or less, the surface shape of the undercoat layer is maintained more satisfactorily.

(Thickness of Polymer Layer Arranged to be in Contact with Polyester Support)

The thickness of one layer of the polymer layer arranged to be in contact with the polyester support is preferably in the range from 1 μl to 20 μm, more preferably from 3 μm to 17 μm, and even more preferably from 5 μm to 15 μm. When the thickness of the polymer layer is 1 μm or more, moisture can hardly penetrate through the surface of the polymer layer to run inside the layer when exposed to a wet heat environment, and moisture can hardly reach the interface between the polymer layer and the polyester support, whereby the adhesiveness of the polymer layer is remarkably improved. Meanwhile, if the thickness of the polymer layer is 20 μm or less, the polymer layer itself can be prevented from being brittle and, when exposed to a wet heat environment, the polymer layer can be prevented from being broken and the adhesiveness thereof can be thereby improved.

(Method for Forming Polymer Layer Arranged to be in Contact with Polyester Support)

The formation of the polymer layer arranged to be in contact with the polyester support can be carried out by a method in which a polymer layer is coextruded during the formation of a polyester support, a method involving coating, or the like. The polymer layer arranged to be in contact with the polyester support is preferably formed by a coating liquid containing a binder and the like onto a polyester support and dried. The method involving coating is preferred from the viewpoints of convenience, uniformity, and formability of a thin film. It is also possible to carry out curing by heating or the like after drying. The solvent in a coating liquid used in the coating method is not particularly limited.

In the present invention, the composite polymer is a latex, and the polymer layer-forming coating liquid is preferably prepared by dispersing the composite polymer.

The coating liquid may be water-based using water as a coating solvent, and may be a solvent that uses an organic solvent such as toluene, methyl ethyl ketone, and the like. Among these, from the viewpoint of the environmental load, a coating liquid using water as a solvent is preferred. The coating solvents may be used singly or as a mixture of two or more kinds thereof.

In the present invention, a step of preparing the polymer layer-forming coating liquid by using water as the dispersion medium and by dispersing the composite polymer in water is preferably included. That is, it is a preferred embodiment that an aqueous dispersion of a polymer having a (poly) siloxane structure in the molecular chain and a crosslinking agent are mixed to prepare an aqueous dispersion in which polymer particles having a (poly)siloxane structure are dispersed in water, and this aqueous dispersion is coated onto an intended polyester support as a water-based coating liquid by a polymer layer-forming step.

As the polymer layer-forming coating liquid, preferred is a water-based coating liquid in which water accounts for 50% by mass or more, and preferably 60% by mass or more with respect to the total mass of the coating solvent. The water-based coating liquid is preferred from the viewpoint of an environmental load, and further, when the proportion of water is 50% by mass or more, the environmental load is particularly reduced. A higher proportion of water accounting for the coating liquid is preferred from the viewpoint of the environment load, and the case where water accounts for 90% by mass or more of the total solvent is particularly preferred.

In addition, the polymer layer is formed by a coating liquid containing water as a coating solvent, which can be confirmed from a fact that the amount of the residual solvent with respect to the total polymer layer of the back protective sheet for a solar cell module is less than 0.01% by mass.

<Other Functional Layers>

The back protective sheet for a solar cell module of the present invention may have functional layers other than the polymer layer arranged to be in contact with the polyester support.

(1) Weather-Resistant Layer

In the back protective sheet for a solar cell module of the present invention, it is preferable that a weather-resistant layer be further provided on the polymer layer arranged to be in contact with the polyester support on the polyester support from the viewpoint of improvement of adhesion durability in a wet heat environment. The weather-resistant layer may or may not include a composite polymer containing the (poly)siloxane structural unit represented by the formula (1) and the non-polysiloxane structural unit, but as the weather-resistant layer, a fluorine-containing polymer layer as described later may be preferably used.

The back protective sheet for a solar cell module of the present invention is arranged on the polymer layer arranged to be in contact with the polyester support.

The fluorine-containing polymer layer is preferably directly provided on the polymer layer arranged to be in contact with the polyester support. The weather-resistant layer that is the fluorine-containing polymer layer includes a fluorine-containing polymer (fluorine-containing polymer) as a main binder. The main binder is a binder of which the content is the largest in the fluorine-containing layer. The weather-resistant layer using the fluorine-containing polymer will be specifically described hereinunder.

(Components of Weather-Resistant Layer)

—Fluorine-Based Polymer—

The fluorine-based polymer for use in the weather-resistant layer is not particularly limited as long as it is a polymer having a recurring unit represented by $-(CFX^1-CX^2X^3)-$ (provided that $X^1$, $X^2$ and $X^3$ each represent a hydrogen atom, a fluorine atom, a chlorine atom, or a perfluoroalkyl group having 1 to 3 carbon atoms). Specific examples of the polymer include polytetrafluoroethylene (which may be hereinafter referred to as PTFE in some cases), polyvinyl fluoride (which may be hereinafter referred to as PVF in some cases), polyvinylidene fluoride (which may be hereinafter referred to as PVDF in some cases), polytrifluoroethylene chloride (which may be hereinafter referred to as PCTFE in some cases), polytetrafluoropropylene (which may be hereinafter referred to as HFP in some cases), and the like.

These polymers may be homopolymers prepared through polymerization of a single monomer or copolymers of two or more kinds of monomers. Examples of the copolymers include a copolymer formed through copolymerization of tetrafluoroethylene and tetrafluoropropylene (abbreviated as P(TFE/HFP)), a copolymer formed through copolymerization of tetrafluoroethylene, vinylidene fluoride (abbreviated as P(TFE/VDF)), and the like.

Further, the polymer for use in the weather-resistant layer may also be a copolymer of a fluorine-based monomer represented by $-(CFX^1-CX^2X^3)-$ and any other monomer. Examples of the copolymer include a copolymer of tetrafluoroethylene and ethylene (abbreviated as P(TFE/E)), a copolymer of tetrafluoroethylene and propylene (abbreviated as P(TFE/P)), a copolymer of tetrafluoroethylene and vinyl ether (abbreviated as P(TFE/VE)), a copolymer of tetrafluoroethylene and perfluorovinyl ether (abbreviated as P(TFE/FVE)), a copolymer of chlorotrifluoroethylene and vinyl ether (abbreviated as P(CTFE/VE)), a copolymer of chlorotrifluoroethylene and perfluorovinyl ether (abbreviated as P(CTFE/FVE)), and the like.

The fluorine-based polymer may be dissolved in an organic solvent, or fine particles thereof may be dispersed in water. From the viewpoint of low environmental load, the latter is preferred. Aqueous dispersions of the fluorine-based polymers are described, for example, in JP-A-2003-231722, JP-A-2002-20409, JP-A-9-194538, or the like.

Furthermore, the fluorine-based polymer is commercially available, and for example, Lumiflon LF200 (manufactured by Asahi Glass Co., Ltd.) ZEFFLE GK-570 (manufactured by Dakikin Industries, Ltd.), OBBLIGATO SW0011F (fluorine-based binder, manufactured by AGC Coat-Tech Co., Ltd.), or the like can be preferably used in the present invention.

As the binder in the weather-resistant layer, the fluorine-based polymers may be used singly or in combination of two or more kinds thereof. Further, any other resin than the fluoropolymer, such as an acrylic resin, a polyester resin, a polyurethane resin, a polyolefin resin, a silicone resin, and the like may be used together with the fluorine-based polymer, within a range not more than 50% by mass of the total binder. However, if the amount of the other resin than the fluorine-based polymer is more than 50% by mass, while if the layer is used in a back sheet, the weather resistance may be reduced in some cases.

The content ratio of the fluorine-based polymer in the weather-resistant layer is preferably in a range of from 0.1 $g/m^2$ to 2.0 $g/m^2$. If the content ratio of the fluorine-based polymer is 0.1 $g/m^2$ or more, the scratching resistance can be improved. Further, if the content ratio of the fluorine-based polymer is 2 $g/m^2$ or less, the proportion of the fluorine-based polymer does not increase too much, and thus, curing of the weather-resistant layer becomes sufficient.

Within the range, from the viewpoint of the surface strength of the weather-resistant layer, the proportion is preferably in a range of from 0.3 $g/m^2$ to 1.5 $g/m^2$, and more preferably in a range of from 0.5 $g/m^2$ to 1.5 $g/m^2$.

—Organic Lubricant—

Preferably, the weather-resistant layer contains at least one organic lubricant. Containing an organic lubricant, the layer is free from the risk of lubricity reduction owing to the fluorine-containing polymer therein (or that is, the layer is free from increase in the kinetic friction coefficient thereof), and as a result, the risk of the layer that would readily be flawed owing to the external force applied thereto, such as scratching, abrasion, collision with small stones or the like can be greatly relaxed. In addition, the lubricant can prevent the coating liquid from undergoing on-plane cissing, which, however, would often occur in use of a fluorine-containing polymer, and as a result, a weather-resistant layer including a fluorine-based polymer having a good surface shape can be formed.

The organic lubricant is preferably contained in the weather-resistant layer in an amount in a range of from 0.2 $mg/m^2$ to 500 $mg/m^2$. If the content ratio of the organic lubricant is 0.2 $mg/m^2$ or more, the scratching resistance of the layer can be sufficiently improved owing to the effect of the organic lubricant to lower the kinetic friction coefficient. On the other hand, when the content ratio of the organic lubricant is 500 $mg/m^2$ or less, coating unevenness and aggregation would hardly occur in forming the weather-resistant layer by coating, and cissing failure would also hardly occur.

Within the above-mentioned range, more preferred is a range of from 1 $mg/m^2$ to 300 $mg/m^2$, particularly preferred is a range of from 5 $mg/m^2$ to 200 $mg/m^2$, and more particularly preferred is a range of from 10 $mg/m^2$ to 150 $mg/m^2$, from the viewpoint of the kinetic friction coefficient-reducing effect and the coatability.

Examples of the organic lubricant include synthetic wax-based compounds, natural wax-based compounds, surfactant-based compounds, inorganic compounds, organic resin-based compounds, and the like. Above all, from the viewpoint of the surface strength of the fluorine-based polymer-containing weather-resistant layer, it is preferable that the organic lubricant contained in the fluorine-based polymer-containing weather-resistant layer be at least one selected from a polyolefin-based compound, a synthetic wax-based compound, a natural wax-based compound, and a surfactant-based compound.

Examples of the polyolefin-based compounds include olefin waxes such as a polyethylene wax, a polypropylene wax, and the like.

Examples of the synthetic wax-based compounds include synthetic hydrocarbon waxes (except olefin waxes), such as esters of stearic acid, oleic acid, erucic acid, lauric acid, behenic acid, palmitic acid, adipic acid or the like, amides, bisamides, ketones, metal salts and their derivatives, Fischer-Tropsch wax, and the like; hydrogenated waxes of phosphates, hardened castor oil, and hardened castor oil derivatives; and the like.

Examples of the natural wax-based compounds include vegetable waxes such as a carnauba wax, a candelilla wax, a Japan wax, and the like; petroleum waxes such as a paraffin wax, a microcrystalline wax, and the like; mineral waxes such as a montan wax and the like; animal waxes such as bees wax, lanolin, and the like; etc.

Examples of the surfactant-based compounds include cationic surfactants such as an alkylamine salt and the like; anionic surfactants such as an alkyl sulfate ester salt and the like; nonionic surfactants such as a polyoxyethylene alkyl ether and the like; ampholytic surfactants such as alkylbetaine and the like; fluorine-based surfactants; etc.

As the organic lubricant, commercially-available products may be used here. Specific examples of the organic lubricant of the polyolefin-based compound include Chemipearl series (for example, Chemipearl W700, W900, W950, and the like) manufactured by Mitsui Chemicals, Inc., Polylon P-502 manufactured by Chukyo Yushi Co., Ltd., and the like;

examples of the organic lubricants of synthetic waxes include Himicron L-271 and Hidrin L-536, both manufactured by Chukyo Yushi Co., Ltd., and the like;

examples of the organic lubricants of natural waxes include Hidrin L-703-35, Selosol 524, Selosol R-586, all manufactured by Chukyo Yushi Co., Ltd., and the like; and examples of the organic lubricants of surfactants include NIKKOL series (for example, NIKKOL SCS, and the like) manufactured by Nikko Chemicals, Ltd., and Emal series (for example, Emal 40 and the like) manufactured by Kao Corp.

Among the those as described above, preferred is adding a polyethylene wax compound as the organic lubricant from the viewpoint of improvement of scratching resistance and surface shape; and above all, Chemipearl series manufactured by Mitsui Chemicals, Inc. is preferably used from the viewpoint that the lubricity can be greatly improved and the scratching resistance and the surface shape improvement can also be improved.

—Other Additives to Weather-Resistant Layer—

If desired, colloidal silica, a silane coupling agent, a crosslinking agent, a surfactant, or the like may be added to the weather-resistant layer.

Colloidal silica may be added to the weather-resistant layer for improving the surface shape.

Colloidal silica to be used herein is such that fine particles containing silicon oxide as the main ingredient thereof exist as a colloidal aggregate in a dispersing medium of water, or a monoalcohol or diol, or a mixture thereof.

The particle diameter of the colloidal silica particles is from about a few nm to 100 nm as the mean primary particle diameter thereof.

The average particle diameter may be measured on an electromicroscopic image taken with a scanning electronic microscope (SEM) or the like, or may be measured with a particle sizer or the like using a dynamic light scattering method, a static light scattering method, or the like.

The shape of the colloidal silica particles may be spherical or such spherical particles may be bonded to each other in long strands.

Colloidal silica particles are available on the market, and examples thereof include Snowtex series manufactured by Nissan Chemicals, Ltd., Cataloid-S series manufactured by JGC Catalysts and Chemicals, Ltd., Levasil series manufactured by Bayer, and the like.

Specific examples thereof include Snowtex ST-20, ST-30, ST-40, ST-C, ST-N, ST-20L, ST-O, ST-OL, ST-S, ST-XS, ST-XL, ST-YL, ST-ZL, ST-OZL, ST-AK, Snowtex-AK series, Snowtex-PS series, and Snowtex-UP series, all manufactured by Nissan Chemicals, Ltd., and the like.

Of those colloidal silicas, preferred for use in the present invention are bead-like bonded long strands, such as Snowtex-UP series.

The amount of the colloidal silica to be added is preferably from 0.3% by mass to 1.0% by mass, and more preferably from 0.5% by mass to 0.8% by mass. If the amount thereof is 0.3% by mass or more, the colloidal silica added can provide a surface shape-improving effect, while if the amount is 1.0% by mass or less, the coating liquid can be prevented from aggregating.

In the case where such colloidal silica is used in the weather-resistant layer, it is preferable that a silane coupling agent be added from the viewpoint of surface shape improvement. As the silane coupling agent, preferred is an alkoxysilane compound, and examples thereof include tetraalkoxysilanes, trialkoxysilanes, and the like. Above all, preferred are trialkoxysilanes, and particularly preferred are alkoxysilane compounds having an amino group. In the case where a silane coupling agent is added, the addition amount thereof is preferably from 0.3% by mass to 1.0% by mass, more preferably from 0.5% by mass to 0.8% by mass, with respect to the weather-resistant layer. If the addition amount is 0.3% by mass or more, an effect of improving the surface shape is obtained, if the addition amount is 1.0% by mass or less, the coating liquid can be prevented from aggregating.

By adding a crosslinking agent to the fluorine-containing polymer layer to form a fluorine-containing polymer layer, a crosslinked structure-derived from the crosslinking agent can be formed in the layer.

Examples of the crosslinking agent for use in the weather-resistant layer include an epoxy-based crosslinking agent, an isocyanate-based crosslinking agent, a melamine-based crosslinking agent, a carbodiimide-based crosslinking agent, an oxazoline-based crosslinking agent, and the like. Examples of the carbodiimide-based crosslinking agent include Carbodilite V-02-L2 (manufactured by Nisshinbo Holdings Inc); and examples of the oxazoline-based crosslinking agent include Epocross WS-700 and Epocross K-2020E (both manufactured by Nippon Shokubai Co., Ltd.), and the like.

As the surfactant for use in the weather-resistant layer, any known surfactants such as an anionic surfactant, a nonionic surfactant, and the like can be used. In the case of adding the surfactant, the addition amount thereof is preferably from 0 mg/m$^2$ to 15 mg/m$^2$, and more preferably from 0.5 mg/m$^2$ to 5 mg/m$^2$. If the amount of the surfactant to be added is 0.1 mg/m$^2$ or more, a good layer can be formed while preventing generation of cissing, while if the amount is 15 mg/m$^2$ or less, the adhesion can be carried out well.

(Configuration of Weather-Resistant Layer)

The thickness of the weather-resistant layer is preferably in a range of from 0.1 μm to 5 μm. If the thickness of the weather-resistant layer is 0.1 μm or more, the durability (weather resistance) as the back protective sheet for a back sheet for a solar cell is sufficient, while if the thickness is 5 μm or less, the surface shape is hardly deteriorated. If the thickness of the weather-resistant layer falls within a range of from 0.5 μm to 5 μm, both the durability and the surface shape can be satisfied, and in particular, a range of from about 0.5 μm to 3 μm is preferred.

In the back protective sheet for a solar cell module of the present invention, any additional layer may be further laminated on the fluorine-containing polymer layer that is the weather-resistant layer. However, from the viewpoint of improvement of the durability of the back protective sheet for a solar cell module, weight reduction, thickness reduction, cost reduction, or the like, it is preferable that the fluorine-containing polymer layer be the outermost layer of the back protective sheet for back sheets.

(Method for Forming Weather-Resistant Layer)

The weather-resistant layer may be formed by applying a coating liquid that contains fluorine-based polymer and the like to constitute the weather-resistant layer, onto the silicone-acryl composite resin-containing polymer layer followed by drying the coating layer. After dried, the layer may be cured by heating or the like. The coating method and the solvent for the coating liquid are not particularly limited.

In the coating method, for example, a gravure coater or a bar coater can be used.

The solvent for use in the coating liquid may be water, or may also be an organic solvent such as toluene, methyl ethyl ketone, or the like. The solvents may be used singly or in combination of two or more kinds thereof. Preferably, a binder such as a fluorine-based polymer and the like is dispersed in water to prepare a water-based coating liquid, and this is coated thereonto. In this case, the proportion of water in the solvent is preferably 60% by mass or more, and more preferably 80% by mass or more. If the amount of water is 60% by mass or more of the solvent contained in the coating liquid to form the fluorine-containing polymer layer, then it is preferable since the environmental load is reduced.

In the back protective sheet for a solar cell module of the present invention, any additional layer may be further laminated on the weather-resistant layer of the fluoropolymer-containing layer. However, from the viewpoint of improvement of the durability of the back protective sheet for a solar cell module, weight reduction, thickness reduction, cost reduction, or the like, it is preferable that the fluorine-containing polymer layer be the outermost layer of the back protective sheet for a solar cell module.

(2) Undercoat Layer

In the back protective sheet for a solar cell module of the present invention, an undercoat layer may be provided between the polyester support and the readily adhesive layer as described later.

The thickness of the undercoat layer is preferably 2 μm or less, more preferably from 0.05 μm to 2 μm, and even more preferably from 0.1 μm to 1.5 μm. If the thickness is 2 μm or less, the surface shape can be maintained satisfactorily. When the thickness is 0.05 μm or more, the layer can secure the necessary adhesiveness easily.

(Components of Undercoat Layer)

—Polymer—

The undercoat layer preferably contains at least one polymer selected from a polyolefin resin, an acrylic resin, and a polyester resin.

The polyolefin resin is preferably, for example, a polymer composed of polyethylene and acrylic acid or methacrylic acid, or the like. As the polyolefin resin, any commercially-available products may be used. Examples thereof include Arrow Base SE-1013N, SE-1010, SD-1010, TC-4010, and TD-4010 (all manufactured by Unitika), Hitec S3148, S3121, and S8512 (all manufactured by Toho Chemical), Chemipearl S-120, S-75N, V100, and EV210H (all manufactured by Mitsui Chemical), and the like. Among these, Arrow Base SE-1013N (manufactured by Unitika) is preferably used.

As the acrylic resin, for example, preferred is a polymer containing polymethyl methacrylate, polyethyl acrylate, or the like. As the acrylic resin, commercially available products may be used, and for example, AS-563A (manufactured by Daicel FineChem) can be preferably used.

The polyester resin is preferably, for example, polyethylene terephthalate (PET), polyethylene-2,6-naphthalate (PEN), or the like. As the polyester resin, commercially available products may be used, and for example, VYLONAL MD-1245 (manufactured by Toyobo Co., Ltd.) can be preferably used.

Among these, from the viewpoint of securing the adhesiveness between the polyester support and the readily adhesive layer as described later, an acrylic resin or a polyolefin resin is preferably used. Further, these polymers may be used singly or in combination of two or more kinds thereof, and in the case of using combination of two or more kinds, a combination of an acrylic resin and a polyolefin resin is preferred.

—Crosslinking Agent—

In the back protective sheet for a solar cell module of the present invention, the undercoat layer preferably contains a crosslinking agent in an amount of 0.5% by mass to 30% by mass with respect to the total binder in each polymer layer.

The crosslinking agent for use in the undercoat layer includes an epoxy-based crosslinking agent, an isocyanate-based crosslinking agent, a melamine-based crosslinking agent, a carbodiimide-based crosslinking agent, an oxazoline-based crosslinking agent, and the like. Among these, in the back protective sheet for a solar cell module of the present invention, the crosslinking agent in the undercoat layer is preferably at least one crosslinking agent selected from a carbodiimide-based crosslinking agent, an oxazoline-based crosslinking agent, and an isocyanate-based crosslinking agent. The description and the preferred ranges of the carbodiimide-based crosslinking agent and the oxazoline-based crosslinking agent for use in the undercoat layer are the same as the description and the preferred ranges of those for use in the weather-resistant layer mentioned hereinabove. The isocyanate-based crosslinking agent is preferably a blocked isocyanate, more preferably a dimethylpyrazole-blocked isocyanate, and particularly preferably a 3,5-dimethylpyrazole-blocked isocyanate. Preferred examples of the isocyanate-based crosslinking agent for use in the present invention include Trixene series DP9C/214 manufactured by Baxenden Chemicals, Ltd., BI7986 manufactured by Baxenden Chemicals, Ltd., and the like.

The amount of the crosslinking agent to be added is preferably from 0.5% by mass to 30% by mass, more preferably from 5% by mass to 20% by mass, and particularly preferably from 3% by mass to less than 15% by mass, with respect to the binder that constitutes the undercoat layer. In particular, if the amount of the crosslinking agent to be added is 0.5% by mass or more, a sufficient crosslinking effect is obtained while the strength and the adhesiveness of the undercoat layer is maintained, while if the amount is 30% by mass or less, the pot life of the coating liquid can be maintained long, while if the amount is less than 15% by mass, the coating surface shape can be improved.

—Surfactant—

The undercoat layer preferably contains an anionic surfactant, a nonionic surfactant, and the like. The range of the surfactant for use in the undercoat layer is the same as a range of from the surfactant for use in the readily adhesive layer as described later. Above all, preferred is use of a nonionic surfactant.

In the case where a surfactant is added, the addition amount thereof is preferably from $0.1$ $mg/m^2$ to $10$ $mg/m^2$, and more preferably from $0.5$ $mg/m^2$ to $3$ $mg/m^2$. If the amount of the surfactant to be added is $0.1$ $mg/m^2$ or more, a good layer can be formed while preventing generation of cissing, while the amount is $10$ $mg/m^2$ or less, the adhesion between the polyester support and the readily adhesive layer as described later can be carried out well.

—Mat Agent—

The undercoat layer preferably contains at least one mat agent. By incorporating a mat agent, deterioration of the physical properties as described below and the lubricity of the polymer layer (that is, an increase in the kinetic friction coefficient) can be further reduced.

The mat agent is preferably a granular material, and may be any of an inorganic material or an organic material. For example, inorganic particles or polymer fine particles may be used. Specifically, preferred examples of the inorganic particles include particles of metal oxides such as titanium oxide, silica, alumina, zirconia, magnesia, and the like; as well as those of talc, calcium carbonate, magnesium carbonate, barium sulfate, aluminum hydroxide, kaolin, clay, and the like.

Preferred examples of the polymer fine particles include particles of an acrylic resin, a polystyrene resin, a polyurethane resin, a polyethylene resin, a benzoguanamine resin, an epoxy resin, and the like. Also preferably, a latex may be added to the coating liquid for forming the undercoat layer, and in such the case, the undercoat layer preferably contains the component derived from the latex.

Above all, in the present invention, the undercoat layer preferably contains at least any one of polymer fine particles and a latex-derived component, and polymethyl methacrylate fine particles, ethyl acrylate latex, or the like can be preferably used.

The average particle diameter of the mat agent is preferably from $0.1$ $\mu m$ to $10$ $\mu m$, and more preferably from $0.1$ $\mu m$ to $8$ $\mu m$, as the secondary particle diameter thereof. If the secondary particle diameter of the mat agent is $10$ $\mu m$ or less, aggregates would hardly form and a risk of cissing can be averted in forming the polymer layer by coating and the embodiment is therefore preferable as readily providing a good coating surface shape. Further, in the case where a latex is used, it is preferable that the particle diameter in the coating liquid fall within the above range.

The average particle diameter is a secondary particle diameter measured with a laser analyzing/scattering particle sizer LA950 [manufactured by Horiba Seisakusho Corp.].

The content of the mat agent in the undercoat layer is preferably in a range of from $0.3$ $mg/m^2$ to $30$ $mg/m^2$, more preferably from $10$ $mg/m^2$ to $25$ $mg/m^2$, and even more preferably from $15$ $mg/m^2$ to $25$ $mg/m^2$. When the content of the mat agent is $30$ $mg/m^2$ or less, aggregates would hardly form and a risk of cissing can be averted in forming the polymer layer by coating and the embodiment is therefore preferable as readily providing a good coating surface shape.

(Physical Properties of Undercoat Layer)

The elastic modulus and the breaking elongation of the undercoat layer each preferably fall within a specific range.

The elastic modulus of the undercoat layer is preferably from 10 MPa to 300 MPa, and more preferably from 20 MPa to 150 MPa.

The breaking elongation of the undercoat layer is from 50% to 1000%, and particularly preferably from 200% to 800%.

(Method for Forming Undercoat Layer)

The method for forming the undercoat layer and the solvent in the coating liquid to be used are not particularly limited.

In the coating method, for example, a gravure coater or a bar coater can be used.

The solvent for use in the coating liquid may be water, or may also be an organic solvent such as toluene, methyl ethyl ketone, and the like. The solvents may be used singly or in combination of two or more kinds thereof. A method in which a binder is dispersed in water to prepare a water-based coating liquid, which is then used for coating, is preferred. In this case, the proportion of water in the solvent is preferably 60% by mass or more, and more preferably 80% by mass or more.

In addition, the coating may be carried out onto the polyester support that has been stretched biaxially or may be first carried out onto the polyester support that has been stretched monoaxially, and then the thus-coated support may be further stretched in the direction different from the first stretching direction. Further, the coating may be carried out onto the support before the stretching and then stretched in two directions.

(3) Ready Adhesion

In the back sheet of the present invention, a readily adhesive layer substantially not containing the composite polymer may be provided. The readily adhesive layer in this case may be a colored layer further having a pigment. The colored layer includes at least a polymer component other than the composite polymer and the pigment, and may be constituted with the use of other components such as various additives, if desired.

The expression "substantially not containing" means that a composite polymer does not contain a composite polymer actively in the readily adhesive layer, and specifically, the content of the composite polymer in the colored layer is 15% by mass or less, with the case where the composite polymer is not contained (the content thereof is 0 (zero) % by mass) being preferred.

When the readily adhesive layer is provided on the polyester support, this case is not limited to an embodiment in which a reflective layer contains the composite polymer as described above, and may also have a configuration with an embodiment in which a polymer layer having one or two or more layers is provided between a reflective layer substantially not containing the composite polymer and a polyester support. In this case, by providing a polymer layer containing the composite polymer between the polyester support and the colored layer, the adhesiveness between the reflective layer and the polyester support and the adhesion are improved and the water resistance may be further enhanced. Thus, weather resistance due to poor adhesion is prevented from being deteriorated.

The readily adhesive layer may be a white pigment-containing white layer. In this case, the white layer may be configured to further include other components such as various additives, if desired.

(Components of Readily Adhesive Layer)

—Binder—

In the readily adhesive layer, it is preferable that at least one polymer selected from a polyolefin resin, an acrylic resin, a polyvinylalcohol resin, a polyurethane resin, and the like be used as a binder from the viewpoint that the adhesiveness to a sealing material such as EVA and the like, used as a sealing material of a solar cell module, can be adjusted to 3 N/mm or more. Above all, from the viewpoint of the durability, a polyolefin resin and a polyurethane resin are preferred.

It is more preferable that the readily adhesive layer include a binder derived from a water-based latex as the binder.

As for preferred examples of the binder, specific examples of the polyolefin include Arrow Base SE-1013N, SE-1010, SD-1010, TC-4010, and TD-4010 (all manufactured by Unitika), Hitec S3148, S3121, and S8512 (all manufactured by Toho Chemical Industry Co., Ltd.), Chemipearl S-120, S-75N, V100, and EV210H (all manufactured by Mitsui Chemicals Inc.), and the like. Among these, Arrow Base SE-1013N (manufactured by Unitika) is preferably used. Further, as a specific example of the polyurethane resin, a polycarbonate-based urethane resin is preferred, and examples thereof include SUPER FLEX 460 (manufactured by Daiichi Kogyo Seiyaku Co., Ltd.), and the like.

The content of the binder in the readily adhesive layer is preferably in a range of from 0.05 g/m$^2$ to 5 g/m$^2$, and more preferably in a range of from 0.08 g/m$^2$ to 3 g/m$^2$. When the content of the binder is 0.05 g/m$^2$ or more, a desired adhesion force can easily be obtained, and when the content is 5 g/m$^2$ or less, a better surface shape can be obtained.

The adhesiveness of the readily adhesive layer to EVA used as a sealing material in a solar cell module is preferably 5 N/cm or more, more preferably more than 30 N/cm, and even more preferably from 50 N/cm to 150 N/cm.

To the readily adhesive layer, if desired, a crosslinking agent, a surfactant, a filler, or the like may be added.

—Crosslinking Agent—

The readily adhesive layer preferably contains a structural part derived from a crosslinking agent that crosslinks polymers.

Examples of the crosslinking agent include crosslinking agents such as an epoxy-based crosslinking agent, isocyanate-based crosslinking agent, a melamine-based crosslinking agent, a carbodiimide-based crosslinking agent, an oxazoline-based crosslinking agent, and the like. By the crosslinking with such a crosslinking agent, the adhesiveness after wet heat aging, concretely, the adhesiveness of the layer to an adjacent material such as a sealing material and the like when exposed to a wet heat environment can be further improved.

Examples of the crosslinking agent include an epoxy-based crosslinking agent, an isocyanate-based crosslinking agent, a melamine-based crosslinking agent, a carbodiimide-based crosslinking agent, an oxazoline-based crosslinking agent, and the like. Among the crosslinking agents, crosslinking agents such as a carbodiimide-based compound, an oxazoline-based compound, and the like are preferred. Examples of the carbodiimide-based crosslinking agent include CARBODILITE V-02-L2 (manufactured by Nisshinbo Industries, Inc.), and examples of the oxazoline-based crosslinking agent include EPOCROSS WS-700 and EPOCROSS K-2020E (both manufactured by Nippon Shokubai Co., Ltd.), and the like. The preferred ranges of these crosslinking agents are the same as the preferred ranges of the crosslinking agent in the polymer layer arranged to be in contact with the polyester support.

The amount of the crosslinking agent to be added is preferably from 5% by mass to 50% by mass, and more preferably from 10% by mass to 40% by mass, relative to the binder in the readily adhesive layer. If the amount of the crosslinking agent to be added is 5% by mass or more, a sufficient crosslinking effect could be obtained while the strength and the adhesiveness of the color layer could be maintained satisfactorily, while if the amount is 50% by mass or less, the pot life of the coating liquid could be maintained long.

—Surfactant—

As the surfactant, any known surfactants such as an anionic surfactant, a nonionic surfactant, and the like can be used. In the case where such a surfactant is added, its addition amount is preferably from 0.1 $mg/m^2$ to 15 $mg/m^2$, and more preferably from 0.5 $mg/m^2$ to 5 $mg/m^2$. If the amount of the surfactant to be added is 0.1 $mg/m^2$ or more, a good layer could be formed while preventing cissing, while if the amount is 15 $mg/m^2$ or less, the adhesion can be carried out well.

(Method for Forming Readily Adhesive Layer)

The readily adhesive layer can be formed according to a method of sticking a pigment-containing back protective sheet for a solar cell module, a method of co-extrusion of a color layer in the formation of a substrate, a method by coating, or the like. Specifically, the readily adhesive layer may be formed on the surface of the polyester support via an undercoat layer therebetween as described later, by sticking, coextrusion, coating, or the like.

Above all, the method by coating is preferred from the viewpoint that it is convenient and enables formation of a uniform and thin film.

In the case where the layer is formed by coating, any known coating method such as a gravure coater, a bar coater, and the like can be used as a coating method.

The coating liquid may be a water-based liquid using water as a coating solvent, or may be a solvent-based liquid using an organic solvent such as toluene, methyl ethyl ketone, or the like. Above all, preferred is use of water as the solvent from the viewpoint of an environmental load. The coating solvents may be used singly or in combination of two or more kinds thereof. Preferred is a coating method in which a water-based coating liquid is formed by dispersing a binder in water, and used for coating. In this case, the proportion of water in the solvent is preferably 60% by mass or more, and more preferably 80% by mass or more.

The readily adhesive layer is more preferably formed by coating. For example, from the residual solvent amount with respect to the total amount of the respective polymer layer in protective sheet for a solar cell of 1000 ppm or less, it can be confirmed that the readily adhesive layer is formed by coating. The residual solvent amount with respect to the total amount of the respective polymer layer in the protective sheet for a solar cell is 500 ppm or less, and particularly preferably 100 ppm or less.

<Method for Producing Back Protective Sheet for Solar Cell Module>

The method for producing the back protective sheet for a solar cell module of the present invention is not particularly limited, but the back protective sheet for a solar cell module of the present invention can be produced by a known preparation method or the like.

Furthermore, the details of the components in the polyester support, and the method for formig a polymer layer arranged to be in contact with the polyester support are the same as illustrated in the description of the back protective sheet for a solar cell module of the present invention.

On the other hand, the other respective layer may be formed by coating, by adhesion, or by extrusion, but is preferably formed by coating. After the coating of the other respective polymer layer-forming coating liquid, a drying step of drying under a desired condition may be provided. The drying temperature in the drying step may be suitably selected depending on the cases of the composition of the coating liquid, the coating amount thereof, and the like.

[Back Sheet for Solar Cell Module]

The back protective sheet for a solar cell module of the present invention can be preferably used as a back sheet for a solar cell module.

In a solar cell that has a laminate structure of "transparent front substrate/element structure part/back protective sheet", in which a transparent substrate arranged on the side on which sunlight is incident (front substrate such as glass substrate or the like), an element structure part (including a photovoltaic cell and a sealing material to seal up the element) and a back protective sheet for a solar cell are laminated, the back protective sheet for a solar cell module of the present invention may be applied to the back protective sheet. Here, the back protective sheet is a protective sheet arranged on the side on which a front substrate is not positioned as seen from the element structure part on the battery-side substrate.

In the present specification, the battery part having a laminate structure of the "transparent front substrate/element structure part", in which an element structure part is positioned on the transparent substrate arranged on the side on which sunlight is incident, is referred to as "battery-side substrate".

From the viewpoint that the polymer layer is excellent in durability against heat, moisture, or the like under a wet heat environment in the back protective sheet for a solar cell module of the present invention, it is particularly preferable that the back protective sheet for a solar cell module of the present invention function as an outermost layer exposed to the outer environment in the case of being used in a solar cell module, that is, as an outermost surface layer (back layer) of the back side.

[Solar Cell Module]

The solar cell module of the present invention includes the back protective sheet for a solar cell module of the present invention as described above arranged as the back sheet for a solar cell module therein. Since the solar cell module of the present invention includes the back protective sheet for a solar cell module of the present invention as described above, it exhibits good power generation performance and excellent weather-resistant performance, and can exert stable power generation performance over a long period of time.

Specifically, the solar cell module of the present invention includes a transparent substrate on which sunlight is incident (front substrate such as a glass substrate and the like), an element structure part arranged on the substrate and having a photovoltaic cell and a sealing material for sealing up the photovoltaic cell, and the back sheet for a solar cell module of the present invention as described above (including the back protective sheet for a solar cell module of the present invention) arranged on the side opposite to the side of the element structure part on which the substrate is positioned, and has a laminate configuration of the "transparent front substrate/element structure part/back sheet". Specifically, the solar cell module is preferably so configured that the element structure part that has a photovoltaic cell capable of converting sunlight energy to electric energy as provided therein is arranged between the transparent front substrate positioned on the side on which sunlight is to directly fall, and the back sheet for a solar cell module of the present invention as described above, and between the front substrate and the back sheet, the photovoltaic cell-containing element structure part (for example, a photovoltaic cell) is sealed up and bonded with a sealing material such as an ethylene-vinyl acetate (EVA)-based sealing material and the like.

Figure 4:
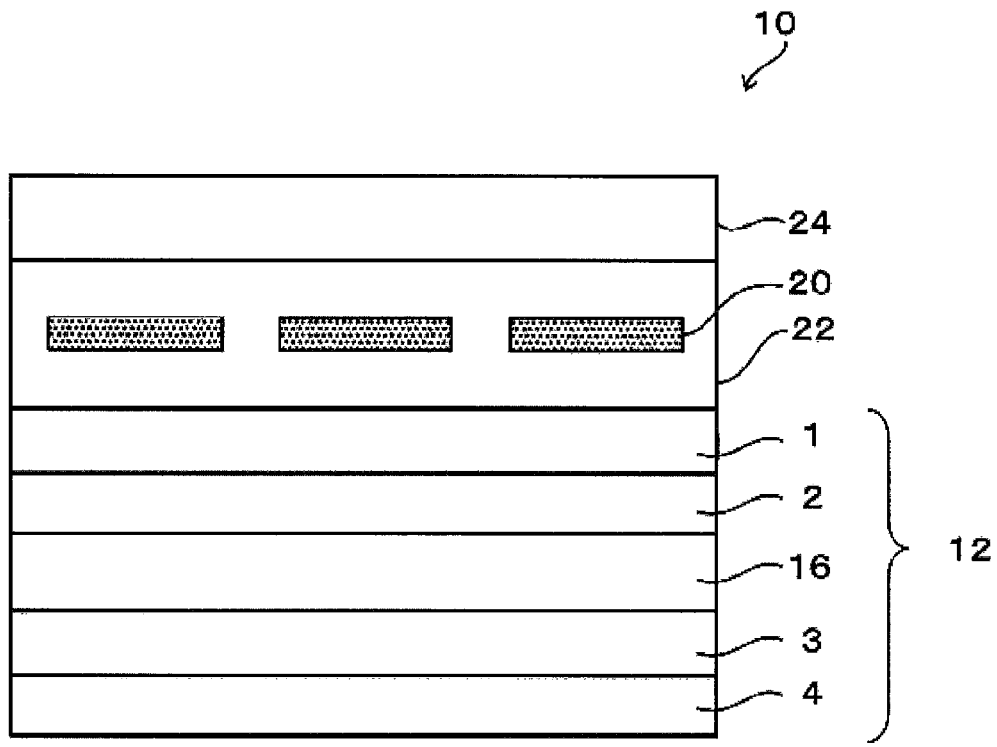
FIG. 4 is a schematic view showing one example of the cross-section of a solar cell module using the back protective sheet for a solar cell module of the present invention.

FIG. 4 schematically shows one example of the configuration of the solar cell module of the present invention. In the solar cell module 10, the photovoltaic cell 20 that converts sunlight energy to electric energy is arranged between the transparent substrate 24 on which sunlight is incident and the back protective sheet 12 for a solar cell module of the present invention as described above, and the space between the substrate and the back protective sheet 12 for a solar cell module is sealed up with the ethylene-vinyl acetate-based sealing material 22. The back protective sheet for a solar cell module of the present embodiment includes a weather-resistant layer 4 that is positioned in contact with the polymer layer 3 on one side of the polyester support 16, and also includes a undercoat layer 2 and a readily adhesive layer 1 on the other surface side (on the side on which sunlight is incident) as the other layer.

The members other than the solar cell module, the photovoltaic cell, and the back protective sheet for a solar cell module are described in detail, for example, in "Solar Power System Constitutive Materials" (supervised by Eiichi Sugimoto, published by Kogyo Chosakai Publishing, 2008).

The transparent substrate may be any one having optical transparency capable of transmitting sunlight therethrough, and can be suitably selected from light-transmissive materials. From the viewpoint of power generation efficiency, preferred are those having a higher light transmittance. As such a substrate, for example, glass substrates, transparent resins such as an acrylic resin and the like, etc. can be suitably used.

For the photovoltaic cell, various known photovoltaic cells, for example, silicon-based elements such as single-crystal silicon, polycrystalline silicon, amorphous silicon; Group III-V or Group II-VI compound semiconductors such as copper-indium-gallium-selenium, copper-indium-selenium, cadmium-tellurium, gallium-arsenic, and the like, etc. can be applied.

EXAMPLES

Hereinafter, the present invention will be described in more detail with reference to the following Examples. In Examples as described below, the material, the amounts and ratios thereof, the details of the treatment, the treatment procedure, and the like may be suitably modified within a range not departing from the spirit of the present invention. Therefore, the range of the present invention should not be construed to be limited by the Examples as described below. Unless otherwise specifically indicated, the "part(s)" is on the basis of mass.

In addition, the volume average particle size was measured hereinafter by using a laser analyzing/scattering particle size distribution analyzer LA-950 (manufactured by HORIBA, Ltd.).

Example 1

—Fabrication of Polyester Support—
<1> Synthesis of Polyester

A slurry of 100 kg of high-purity terephthalic acid (manufactured by Mitsui Chemicals, Inc.) and 45 kg of ethylene glycol (manufactured by Nippon Shokubai Co., Ltd.) was sequentially fed over 4 hours into an esterification tank previously charged with about 123 kg of bis(hydroxyethyl) terephthalate and kept at a temperature of 250° C. and a pressure of $1.2 \times 10^5$ Pa. After completion of the feeding, the esterification was further carried out over 1 hour. Subsequently, 123 kg of the obtained esterification product was transferred into a polycondensation tank.

Subsequently, ethylene glycol was added to the polycondensation tank in which the esterification product had been transferred, in an amount of 0.3% by mass of the polymer to be obtained. After this was stirred for 5 minutes, an ethylene glycol solution of cobalt acetate and manganese acetate was added thereto so that the cobalt element-equivalent amount and the manganese element-equivalent addition amount may be 30 ppm and 15 ppm, respectively, of the polymer to be obtained. Further, this was stirred for 5 minutes, and then an ethylene glycol solution of 2% by mass of a titanium alkoxide compound was added thereto so that the titanium element-equivalent addition amount may be 5 ppm of the polymer to be obtained. After 5 minutes, an ethylene glycol solution of 10% by mass of ethyl diethylphosphonoacetate was added thereto so that the phosphorus element-equivalent addition amount thereof added may be 5 ppm of the polymer to be obtained. Next, with stirring the lower polymer at 30 rpm, the reaction system was gradually heated from 250° C. up to 285° C. and the pressure was lowered to 40 Pa. The time to the final temperature and that to the final pressure were both 60 minutes. After the reaction was continued as such for 3 hours, the reaction system was purged with nitrogen, and the pressure therein was restored to an ordinary pressure to thereby stop the polycondensation reaction. With that, the obtained polymer melt was strandwise jetted out into cold water and immediately cut to fabricate polymer pellets (a diameter of about 3 mm and a length of about 7 mm).

As the titanium alkoxide compound, a titanium alkoxide compound (Ti content=4.44% by mass) synthesized in Example 1 in paragraph No. [0083] in JP-A-2005-340616 was used.

<2> Solid-Phase Polymerization

The polyester pellets obtained above were kept at a temperature of 220° C. for 36 hours in a vacuum chamber kept at 40 Pa to carry out solid-phase polymerization. Polyester pellets after the solid-phase polymerization were obtained.

<3> Preparation of Master Batch of Pigment—

50 kg of the polyester pellet after the solid-phase polymerization obtained in <2> above and 50 kg of Titanium Oxide 1 (JR600A, rutile type titanium oxide manufactured by Tayca Corp.; in which the outermost layer is surface-treated with $Al_2O_3$) were mixed, and a master batch of titanium oxide was prepared using a double-screw kneading extruder. That is, a PET resin was added thereto from the hopper, and melt kneading was carried out while a powder form of titanium oxide was metered from the hopper using a feeder. The kneaded composition was extruded into a strand shape, then cooled with water, and cut to fabricate a master batch of titanium oxide.

<4> Production of Master Batch of Terminal Blocking Agent—

On the other hand, 900 kg of the polyester pellet after the solid-phase polymerization obtained in <2> above was mixed with 100 kg of an terminal blocking agent (STABAXOL P400 (a carbodiimide compound having a weight average molecular weight of about 20000, manufactured by Rhein Chemie Corp., Japan)) to prepare a master batch of an terminal blocking agent using a double-screw kneading extruder. That is, a PET resin was added thereto from the hopper, a powder form of an terminal blocking agent was introduced by metering from the hopper using a feeder, and the terminal blocking agent of a liquid was added from a pot part provided in the double-screw kneading extruder to perform melt-kneading. The kneaded composition was extruded into a strand shape, then cooled with water, and cut to produce a master batch of the terminal blocking agent.

<5> Fabrication of Film-Shaped Polyester Support

The polyester pellet after the solid-phase polymerization obtained in <2> above, the master batch of the pigment obtained in <3> above, and the master batch of the terminal blocking agent obtained in <4> above were mixed so that the mixing ratio of the polyester, the pigment, and the terminal blocking agent be 89.7 parts by mass, 10.0 parts by mass, and 0.3 parts by mass, respectively, to obtain a mixture.

The obtained mixture was melt-extruded by a double-screw melt extruder at 280° C. and cast onto a metal drum to fabricate an unstretched base having a thickness of about 2.5 mm. Subsequently, this was stretched in MD direction (vertical direction; Machine Direction) at 90° C. by 3.4 times. Further, at 120° C., this was stretched in TD direction (horizontal direction; Transverse Direction) by 4.5 times, then subjected to a thermal fixation treatment at a film surface temperature of 200° C. for 15 seconds, and thereafter thermally relaxed at 190° C. in the MD/TD directions at 5% and 11%, respectively. Thus obtained was a polyester support that is biaxially stretched and then subjected to a thermal fixation treatment (which may be hereinafter simply referred to as a polyester support in some cases) having a thickness of 240 μm.

—Formation of Polymer Layer in Contact with Polyester Support—

(1) Preparation of Titanium Dioxide Dispersion

Using a Dyno Mill disperser, titanium dioxide was dispersed to have an average particle diameter of 0.42 μm to prepare a titanium dioxide dispersion. The average particle diameter of titanium dioxide was measured using Microtrack FRA manufactured by Honeywell.

(Composition of Titanium Dioxide Dispersion)

| | |
|---|---|
| Titanium dioxide (Taipake CR-95, manufactured by Ishihara Sangyo, powder) | 455.8 parts by mass |
| Aqueous PVA solution (PVA-105, manufactured by Kuraray, concentration 10% by mass) | 227.9 parts by mass |
| Dispersing agent (Demol EP, manufactured by Kao, concentration 25% by mass) | 5.5 parts by mass |
| Distilled water | 310.8 parts by mass |

(2) Preparation of Coating Liquid for Forming Polymer Layer in Contact with Polyester Support The respective components in the following compositions were mixed to prepare a polymer layer-forming coating liquid in contact with a polyester support.

<Composition of Coating Liquid for Forming Polymer Layer in Contact with Polyester Support>

| | |
|---|---|
| Silicone binder (CERANATE WSA1070, manufactured by DIC, silicone/acryl composite polymer, polysiloxane structural units: carboxyl group-containing acryl structural units = about 30%: about 70% (molar ratio), concentration 38% by mass) | 396.5 parts by mass |
| Titanium oxide dispersion as prepared above | 493.9 parts by mass |
| Nonionic surfactant (Naroacty CL95, manufactured by Sanyo Chemical, concentration 1% by mass) | 15.0 parts by mass |
| Oxazoline-based crosslinking agent (Epocross WS-700, manufactured by Nippon Shokubai Co., Ltd., concentration 25% by mass) | 180.8 parts by mass |
| Distilled water | 28.8 parts by mass |

(3) Formation of Polymer Layer in Contact with Polyester Support

The polyester support was subjected to a corona treatment under the following conditions.

Gap clearance between electrode and dielectric roll: 1.6 mm

Treatment frequency: 9.6 kHz

Treatment speed: 20 m/sec

Treatment intensity: 0.375 kV·A·min/m$^2$

Next, the polymer layer-forming coating liquid in contact with the polyester support was coated onto the corona-treated surface of the polyester support in such a manner that the binder coating amount might be 5.1 g/m$^2$ and the titanium dioxide coating amount might be 7.6 g/m$^2$, and then dried at 175° C. for 2 minutes to form a polymer layer in contact with the polyester support, having a dry thickness of 8 μm.

Thus, a back protective sheet for a solar cell module of Example 1 was fabricated, in which a polymer layer in contact with the polyester support was provided to be in contact with one surface of the polyester support.

Examples 2 to 18 and
Comparative Examples 1 to 12

In the same manner as in Example 1, except that the kind of the resin in the polyester support, the kind and addition amount of the white pigment, the amount of the terminal blocking agent to be added, and the presence of addition of a binder, a pigment, and a crosslinking agent to the polymer layer in contact with the polyester support in Example 1 were changed as described in Table 1 below, the back protective sheets for a solar cell module in Examples 2 to 18 and Comparative Examples 1 to 12, provided to be in contact with one side of the polyester support, were fabricated.

In Table 1 below, PEN represents a polyethylene naphthalate resin and PBT represents a polybutylene terephthalate resin. Further, the titanium oxide 2 used as a pigment of the polyester support is trade name FTR-700 manufactured by Sakai Chemical Industry Co., Ltd., which has an outermost layer surface-treated with $Al_2O_3$ and a second layer surface-treated with $SiO_2$; the titanium oxide 3 is trade name R-106 manufactured by Dupont, which has an outermost layer surface-treated with $SiO_2$; the titanium oxide 4 is trade name PF-739 manufactured by Ishihara Sangyo Kaisha, Ltd., which has an outermost layer surface-treated with $SiO_2$ and a second layer surface-treated with $Al_2O_3$. Barium sulfate used as the pigment of the polyester support is trade name B-30, manufactured by Sakai Chemical Industry Co., Ltd., and the hollow particle is trade name SX866 (B) manufactured by JSR Corp.

(Evaluation)

The back protective sheet for a solar cell module fabricated in each of Examples and Comparative Examples was evaluated. The evaluation results are shown in Table 1 below.

(Peeling Rate after PCT)

The surface of the polymer layer of the back protective sheet for a solar cell module was subjected to a wet heat treatment (PCT) in an atmosphere at 120° C. and at a relative humidity of 100% for 90 hours. Then, using a razor, the surface was cross-cut at intervals of 3 mm to form 6 cuts each in the lengthwise direction and the widthwise direction. Next, a Mylar tape having a width of mm was stuck thereonto and rapidly peeled in the direction of 90 degrees.

According to the number of the peeled cross-cuts, the peeling rate was calculated.

(Half-Value Period of Elongation at Break in PCT)

For the obtained back protective sheet for a solar cell module, the time taken until the retention (%) of elongation at break became 50% as calculated according to the following equation, based on the measured values $L^0$ and $L^1$ of the elongation at break obtained by the following measurement method. The half-value of elongation at break within a range available in practical use is 3000 hours or longer, preferably 3500 hours or more, and more preferably 4000 hours or more.

$$\text{Retention of Elongation at Break}(\%) = (L^1/L^0) \times 100$$

<Measurement of Elongation at Break>

The back protective sheet for a solar cell module on which the coating layers described in Tables 1 and 2 below had been formed was cut into a size of width 10 mm×length 200 mm, to prepare test sample pieces A and B. The sample piece A was conditioned in an atmosphere at 25° C. and at a relative humidity of 60% for 24 hours, and then tested according to a tensile test with a tensilon (RTC-1210A manufactured by Orientec Co., Ltd.). Further, the length of the sample piece to be stretched was 10 cm and the pulling rate was 20 mm/min. The elongation at break of the sample piece A to be obtained in this test is referred to as $L^0$.

Separately, the sample piece B was subjected to a wet heat treatment (PCT) in an atmosphere at 120° C. and at a relative humidity of 100% for 105 hours, and then tested according to the same tensile test as that for the sample piece A. The elongation at break of the sample piece B in this test is referred to as $L^1$.

(Change in b Values in UV Resistance Test)

For the obtained back protective sheet for a solar cell module, the b value was measured using ND-101D (manufactured by Nippon Denshoku Industries co., Ltd.).

Thereafter, a UV irradiation test (a total irradiation dose of 45 Kwh/m² according to the UV test of IEC61215) was carried out. The b values of the back protective sheet for a solar cell module after this UV resistance test were also measured using ND-101D (manufactured by Nippon Denshoku Industries co., Ltd.).

The change in the b values between the b values obtained before and after the UV resistance test.

(Reflectance)

The reflectance was measured for light at 550 nm on the surface on which the polymer layer of the back protective sheet for a solar cell module had been formed, using a device having a spectrophotometer UV-2450 (manufactured by Shimadzu Corp.) equipped with an integrating sphere attached device ISR-2200. Note that, as a reference, a light reflectance of a barium sulfate standard plate was measured and taken as 100%. Based on the reference, the reflectance of the back protective sheet for a solar cell module was calculated.

The reflectance is preferably 80% or more, more preferably 85% or more, and particularly preferably 90% or more.

TABLE 1

| | Composition of polymer layer material | | | Composition of support material | | | | | |
|---|---|---|---|---|---|---|---|---|---|
| | | | | Resin | White pigment | | | | |
| | Binder | White pigment | Crosslinking agent | Kind | Kind | Surface treatment of outermost layer | Surface treatment of second layer | Amount to be added (% by mass) | Terminal blocking agent (% by mass) |
| Example 1 | Contained | Contained | Contained | PET | Titanium oxide 1 | Al$_2$O$_3$ | — | 10.0 | 0.3 |
| Example 2 | Contained | Contained | Contained | PET | Titanium oxide 2 | Al$_2$O$_3$ | SiO$_2$ | 10.0 | 0.3 |
| Example 3 | Contained | Contained | Contained | PET | Titanium oxide 3 | SiO$_2$ | — | 10.0 | 0.3 |
| Example 4 | Contained | Contained | Contained | PET | Titanium oxide 4 | SiO$_2$ | Al$_2$O$_3$ | 10.0 | 0.3 |
| Example 5 | Contained | Contained | Contained | PET | Titanium oxide 1 | Al$_2$O$_3$ | — | 3.0 | 0.3 |
| Example 6 | Contained | Contained | Contained | PET | Titanium oxide 1 | Al$_2$O$_3$ | — | 5.0 | 0.3 |
| Example 7 | Contained | Contained | Contained | PET | Titanium oxide 1 | Al$_2$O$_3$ | — | 15.0 | 0.3 |
| Example 8 | Contained | Contained | Contained | PET | Titanium oxide 1 | Al$_2$O$_3$ | — | 20.0 | 0.3 |
| Example 9 | Contained | Contained | Contained | PET | Titanium oxide 1 | Al$_2$O$_3$ | — | 10.0 | 0.1 |
| Example 10 | Contained | Contained | Contained | PET | Titanium oxide 1 | Al$_2$O$_3$ | — | 10.0 | 0.2 |
| Example 11 | Contained | Contained | Contained | PET | Titanium oxide 1 | Al$_2$O$_3$ | — | 10.0 | 0.5 |
| Example 12 | Contained | Contained | Contained | PET | Titanium oxide 1 | Al$_2$O$_3$ | — | 10.0 | 1.0 |
| Example 13 | Contained | Contained | Contained | PET | Titanium oxide 1 | Al$_2$O$_3$ | — | 10.0 | 2.0 |
| Example 14 | Contained | Contained | Contained | PET | Barium sulfate | Al$_2$O$_3$ | — | 10.0 | 0.3 |
| Example 15 | Contained | Contained | Contained | PET | Barium sulfate | Al$_2$O$_3$ | — | 20.0 | 0.3 |
| Example 16 | Contained | Contained | Contained | PET | Hollow particle | — | — | 20.0 | 0.3 |
| Example 17 | Contained | Contained | Contained | PEN | Titanium oxide 1 | Al$_2$O$_3$ | — | 10.0 | 0.3 |
| Example 18 | Contained | Contained | Contained | PBT | Titanium oxide 1 | Al$_2$O$_3$ | — | 10.0 | 0.3 |
| Comparative Example 1 | Contained | Contained | Contained | PET | Titanium oxide 1 | Al$_2$O$_3$ | — | 10.0 | 0.0 |
| Comparative Example 2 | Contained | Contained | Contained | PET | Titanium oxide 2 | Al$_2$O$_3$ | SiO$_2$ | 10.0 | 0.0 |
| Comparative Example 3 | Contained | Contained | Contained | PET | Titanium oxide 3 | SiO$_2$ | — | 10.0 | 0.0 |
| Comparative Example 4 | Contained | Contained | Contained | PET | Titanium oxide 4 | SiO$_2$ | Al$_2$O$_3$ | 10.0 | 0.0 |
| Comparative Example 5 | Contained | Contained | Contained | PET | White pigment not added to support | | | 0.0 | 0.3 |
| Comparative Example 6 | Contained | Contained | Contained | PET | White pigment not added to support | | | 0.0 | 0.0 |

TABLE 1-continued

| | | | | | | | | | |
|---|---|---|---|---|---|---|---|---|---|
| Comparative Example 7 | No | Contained | Contained | PET | Titanium oxide 1 | Al$_2$O$_3$ | — | 10.0 | 0.3 |
| Comparative Example 8 | No | No | Contained | PET | Titanium oxide 1 | Al$_2$O$_3$ | — | 10.0 | 0.3 |
| Comparative Example 9 | No | Contained | No | PET | Titanium oxide 1 | Al$_2$O$_3$ | — | 10.0 | 0.3 |
| Comparative Example 10 | Contained | No | No | PET | Titanium oxide 1 | Al$_2$O$_3$ | — | 10.0 | 0.3 |
| Comparative Example 11 | Contained | No | Contained | PET | Titanium oxide 1 | Al$_2$O$_3$ | — | 10.0 | 0.3 |
| Comparative Example 12 | Contained | Contained | No | PET | Titanium oxide 1 | Al$_2$O$_3$ | — | 10.0 | 0.3 |

| | Characteristics of back protective sheet for solar cell module | | | |
|---|---|---|---|---|
| | Peeling rate between polymer layer and support after 90 hours of PCT % | Half-value of elongation at break in PCT Time | Change in b values in UV resistance test — | Reflectance % |
| Example 1 | 0 | 4000 | 0.1 | 90 |
| Example 2 | 0 | 4000 | 0.1 | 90 |
| Example 3 | 15 | 4000 | 0.1 | 90 |
| Example 4 | 15 | 4000 | 0.1 | 90 |
| Example 5 | 15 | 5500 | 0.1 | 85 |
| Example 6 | 0 | 5000 | 0.1 | 87 |
| Example 7 | 0 | 4000 | 0.1 | 92 |
| Example 8 | 15 | 3500 | 0.1 | 94 |
| Example 9 | 15 | 3500 | 0.1 | 90 |
| Example 10 | 0 | 4000 | 0.1 | 90 |
| Example 11 | 0 | 5000 | 0.1 | 90 |
| Example 12 | 15 | 6000 | 0.1 | 90 |
| Example 13 | 30 | 9000 | 0.2 | 90 |
| Example 14 | 15 | 3500 | 0.2 | 84 |
| Example 15 | 30 | 3000 | 0.2 | 89 |
| Example 16 | 30 | 3000 | 0.5 | 80 |
| Example 17 | 0 | 9000 | 0.3 | 90 |
| Example 18 | 0 | 7000 | 0.1 | 90 |
| Comparative Example 1 | 75 | 3500 | 0.1 | 90 |
| Comparative Example 2 | 75 | 3500 | 0.1 | 90 |
| Comparative Example 3 | 75 | 3500 | 0.1 | 90 |
| Comparative Example 4 | 75 | 3500 | 0.1 | 90 |
| Comparative Example 5 | 50 | 6000 | 0.1 | 78 |
| Comparative Example 6 | 50 | 4000 | 0.1 | 78 |
| Comparative Example 7 | 100 | 4000 | 3 | 90 |
| Comparative Example 8 | 100 | 4000 | 35 | 85 |
| Comparative Example 9 | 100 | 4000 | 3 | 90 |
| Comparative Example 10 | 100 | 4000 | 35 | 85 |
| Comparative Example 11 | 50 | 4000 | 35 | 85 |
| Comparative Example 12 | 100 | 4000 | 3 | 90 |

As shown from Table 1 above, a back protective sheet for a solar cell module having good adhesion to the polyester support and the polymer layer after wet heat aging was obtained in Examples 1 to 18.

On the other hand, it could be seen that from Comparative Examples 1 to 4, in the case where an terminal blocking agent was not added to the polyester support, the adhesion between the polyester support and the polymer layer after wet heat aging is poor. From Comparative Examples 5 and 6, it could be seen that in the case where an terminal blocking agent is not added to the polyester support, the adhesion between the polyester support and the polymer layer after wet heat aging is poor. From Comparative Example 7, it could be seen that in the case where a binder is not added to the polymer layer in contact with the polyester support, the adhesion between the polyester support and the polymer layer after wet heat aging is poor. From Comparative Example 11, it could be seen that in the case where a pigment is not added to the polymer layer in contact with the polyester support, the adhesion between the polyester support and the polymer layer after wet heat aging is poor. From Comparative Example 12, it could be seen that in the case where a crosslinking agent is not added to the polymer layer in contact with the polyester support, the adhesion between the polyester support and the polymer layer after wet heat aging is poor.

Example 19

In the same manner as in Example 1 except that carbon black was further added in an amount of 10% by mass with respect to the binder, a back protective sheet for a solar cell module of Example 19, which was provided to be in contact with the polymer layer on one surface of the polyester support, was fabricated.

The performance of the obtained back protective sheet for a solar cell module of Example 19 was evaluated in the same manner as in Example 1, and as a result, the adhesion between the polyester support and the polymer layer after wet heat aging, the half-value period of elongation at break after PCT, and the change in b values in the UV resistance test were all good. Further, it could be seen that the back protective sheet for a solar cell module of Example 19 was black visually and had excellent design properties.

Examples 101 to 118

A fluorine-based polymer-containing weather-resistant layer as described later was formed on the polymer layer provided to be in contact with the polyester support of the back protective sheet for a solar cell module of Examples 1 to 18, and the undercoat layer as described later and the readily adhesive layer as described later were formed on the surface opposite to the surface on which the polymer layer of the polyester support was formed, thereby preparing back protective sheets for a solar cell module of Examples 101 to 118.

The detailed method for forming each of the layers is shown below.

—Formation of Fluorine-Based Polymer-Containing Weather-Resistant Layer—

The following components were mixed to prepare a coating liquid for forming a fluorine-based polymer-containing weather-resistant layer.

(Composition of Coating Liquid for Forming Fluorine-Based Polymer-Containing Weather-Resistant Layer)

| | |
|---|---|
| Fluorine-based binder (OBBLIGATO SW0011F, manufactured by AGC Coat-tech, concentration 36% by mass) | 345.0 parts by mass |
| Colloidal silica (Snowtex UP, manufactured by Nissan Chemical, concentration 20% by mass) | 3.9 parts by mass |
| Silane coupling agent (TSL8340, manufactured by Momentive Performance Material, concentration 1% by mass) | 78.5 parts by mass |
| Organic lubricant (Chemipearl W950, manufactured by Mitsui Chemical, concentration 5% by mass) | 207.6 parts by mass |
| Nonionic surfactant (Naroacty CL95, manufactured by Sanyo Chemical, concentration 1% by mass) | 60.0 parts by mass |
| Carbodiimide-based crosslinking agent (Carbodilite V-02-L2, manufactured by Nisshinbo, concentration 20% by mass) | 62.3 parts by mass |
| Distilled water | 242.8 parts by mass |

The coating liquid for forming a fluorine-based polymer-containing weather-resistant layer was coated on the polymer layer provided to be in contact with the polyester support in the above in such a manner that the binder coating amount might be 1.3 g/m², and dried at 175° C. for 2 minutes to form a fluorine-based polymer-containing weather-resistant layer.

—Formation of Undercoat Layer—

The respective components in the following composition were mixed to prepare an undercoat layer-forming coating liquid.

<Composition of Coating Liquid>

| | |
|---|---|
| Polyolefin binder (Arrow Base SE-1013N, manufactured by Unitika, concentration 20% by mass) | 35.6 parts by mass |
| Acrylic binder (AS-563A, manufactured by Daicel Finechem, concentration 28% by mass) | 25.7 parts by mass |
| PMMA fine particles (MP-1000, manufactured by Soken Chemical, concentration 5% by mass) | 10.0 parts by mass |
| Nonionic surfactant (Naroacty CL95, manufactured by Sanyo Chemical, concentration 1% by mass) | 15.0 parts by mass |
| Carbodiimide-based crosslinking agent (Carbodilite V-02-L2, manufactured by Nisshinbo, concentration 20% by mass) | 12.3 parts by mass |
| Oxazoline-based crosslinking agent (Epocross WS-700, manufactured by Nippon Shokubai Co., Ltd., concentration 25% by mass) | 3.0 parts by mass |
| Distilled water | 898.4 parts by mass |

The surface opposite to the surface having the polymer layer formed in Examples 1 to 18 of the polyester support was corona-treated under the following condition.

Gap clearance between electrode and dielectric roll: 1.6 mm

Treatment frequency: 9.6 kHz

Treatment speed: 20 m/min

Treatment intensity: 0.375 kV·A·min/m²

Next, the undercoat layer-forming coating liquid was coated onto the corona-treated surface of the polyester support in such a manner that the binder coating amount might be 0.12 g/m², and then dried at 180° C. for 2 minutes to form an undercoat layer.

—Formation of Readily Adhesive Layer—

(1) Preparation of Readily Adhesive Layer-Forming Coating Liquid

The components in the following composition were mixed to prepare readily adhesive layer-forming coating liquid.

<Composition of Readily Adhesive Layer-Forming Coating Liquid>

| | |
|---|---|
| Polyolefin binder (Arrow Base SE-1013N, manufactured by Unitika, concentration 20% by mass) | 79.3 parts by mass |
| Nonionic surfactant (Naroacty CL95, manufactured by Sanyo Kasei, concentration 1% by mass) | 1.3 parts by mass |
| Oxazoline-type crosslinking agent (Epocross WS-700, manufactured by Nippon Shokubai Co., Ltd., concentration 25% by mass) | 13.6 parts by mass |
| Distilled water | 5.8 parts by mass |

(2) Formation of Readily Adhesive Layer

The obtained readily adhesive layer-forming coating liquid was coated onto the undercoat layer of the polyester support in such a manner that the binder coating amount might be 4.7 g/m², and then dried at 170° C. for 2 minutes to form a readily adhesive layer.

As in the above, the polymer layer and the fluorine-based polymer-containing weather-resistant layer were provided on the surface of the polyester support in that order on the side nearer to the support, and on the opposite side thereof, the undercoat layer and the readily adhesive layer were arranged in that order nearer on the side nearer to the support, to fabricate a back protective sheet for a solar cell module of Examples 101 to 118.

Example 201

<(3) Fabrication of Solar Cell Module>

A reinforced glass plate having a thickness of 3 mm, an EVA sheet (SC50B manufactured by Mitsui Chemical Fabro, Inc.), a crystalline photovoltaic cell, an EVA sheet (SC50B manufactured by Mitsui Chemical Fabro, Inc.), and the back protective sheet for a solar cell module of Example 101 were laminated in that order and in such a manner that the readily adhesive layer of the back protective sheet for a solar cell module might be in direct contact with the EVA sheet, and hot-pressed using a vacuum laminator (Vacuum Laminator manufactured by Nisshinbo Holdings, Inc.) to cause the layer to adhere to EVA. Further, the adhesion method is as follows.

<Adhesion Method>

Using a vacuum laminator, the sample was evacuated at 128° C. for 3 minutes and the pressed for 2 minutes for pre-adhesion, followed by being subjected to a final adhesion treatment in a dry oven at 150° C. for 30 minutes.

As in the above, a crystalline solar cell module of Example 201 was fabricated. Thus fabricated, the solar cell module was left in an environment condition at 120° C. and at a relative humidity of 100% for 70 hours, and the driven for power generation. As a result, the module exhibited good power generation performance as a solar cell.

Examples 202 to 218

Solar cell modules of Examples 202 to 218 were fabricated in the same manner as in Example 201, except that the back protective sheets for a solar cell module fabricated in Examples 102 to 118 were used in place of the protective sheet for a solar cell fabricated in Example 1.

In the same manner as in Example 201, the obtained solar cell modules were driven for power generation, and as a result, all the modules exhibited good power generation performance as a solar cell.

While the present invention has been described in detail and with reference to specific embodiments thereof, it will be apparent to one skilled in the art that various changes and modifications can be made therein without departing from the spirit and scope thereof.

The present disclosure relates to the subject matter contained in International Application No. PCT/JP2013/051699 filed Jan. 28, 2013; and Japanese Patent Application No. 2012-021864 filed Feb. 3, 2012, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims.

REFERENCE SIGNS LIST 1 readily adhesive layer
2 undercoat layer
3 polymer layer arranged to be in contact with the polyester support
4 weather-resistant layer
12 back protective sheet for solar cell module
16 polyester support that is biaxially stretched and then subjected to thermal fixation treatment
22 sealing material
20 photovoltaic cell
24 transparent front substrate (back protective sheet for solar cell module or reinforced glass)
10 solar cell module

What is claimed is:

1. A back protective sheet for a solar cell module comprising:
   a polyester support that is biaxially stretched and then subjected to a thermal fixation treatment; and
   a polymer layer arranged to be in contact with at least one surface of the polyester support,
   wherein the polymer layer contains a binder having at least one functional group selected from a carboxyl group, a hydroxyl group, an amino group, a sulfonic acid group, and a carbonyl group; a pigment; and a crosslinking agent-derived structure,
   wherein the polyester support contains a polyester, a pigment, and an terminal blocking agent,
   wherein the polyester support contains the terminal blocking agent in an amount of 0.2% by mass to 0.5% by mass with respect to the polyester support,
   wherein the pigment in the polyester support is titanium oxide having an Al-treated outermost surface, and
   wherein the polyester support contains the pigment in an amount of 5% by mass to 15% by mass with respect to the polyester support.

2. The back protective sheet for a solar cell module according to claim 1, wherein the terminal blocking agent is a polycarbodiimide.

3. The back protective sheet for a solar cell module according to claim 2, wherein the polycarbodiimide has a molecular weight of 3000 to 50000.

4. The back protective sheet for a solar cell module according to claim 2, wherein the polycarbodiimide has a melting point of 80° C. to 170° C.

5. The back protective sheet for a solar cell module according to claim 1, wherein the binder contained in the polymer layer is a water-based latex.

6. The back protective sheet for a solar cell module according to claim 1, wherein the binder contained in the polymer layer contains a composite polymer including a recurring portion of a siloxane structural unit represented by the below-identified formula (1) in an amount of 15% by mass to 99% by mass, and a recurring portion of a non-siloxane structural unit copolymerizable with the recurring portion in an amount of 85% by mass to 1% by mass in the molecule:

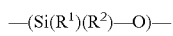   Formula (1)

wherein $R^1$ and $R^2$ each independently represent a hydrogen atom, a halogen atom, or a monovalent organic group capable of covalent-bonding to the Si atom, n represents a natural number, and when n is 2 or more, a plurality of $R^1$ and $R^2$ may be the same as or different from each other.

7. The back protective sheet for a solar cell module according to claim 1, wherein the binder contained in the polymer layer has a carboxyl group.

8. The back protective sheet for a solar cell module according to claim 1, wherein the polymer layer contains a black pigment.

9. The back protective sheet for a solar cell module according to claim 1, wherein the polymer layer has a thickness of from 1 μm to 20 μm.

10. The back protective sheet for a solar cell module according to claim 1, wherein the polymer layer is formed by coating onto a polyester support that is biaxially stretched and then subjected to a thermal fixation treatment.

11. A solar cell module including a back protective sheet comprising:
 a polyester support that is biaxially stretched and then subjected to a thermal fixation treatment; and
 a polymer layer arranged to be in contact with at least one surface of the polyester support,
 wherein the polymer layer contains a binder having at least one functional group selected from a carboxyl group, a hydroxyl group, an amino group, a sulfonic acid group, and a carbonyl group; a pigment; and a crosslinking agent-derived structure,
 wherein the polyester support contains a polyester, a pigment, and an terminal blocking agent,
 wherein the polyester support contains the terminal blocking agent in an amount of 0.2% by mass to 0.5% by mass with respect to the polyester support,
 wherein the pigment in the polyester support is titanium oxide having an Al-treated outermost surface, and
 wherein the polyester support contains the pigment in an amount of 5% by mass to 15% by mass with respect to the polyester support.

* * * * *